United States Patent
Kobayashi

(10) Patent No.: US 8,013,498 B2
(45) Date of Patent: Sep. 6, 2011

(54) ELECTRONIC DEVICE HAVING A PIEZOELECTRIC VIBRATING REED WITH A DISCONTINUOUS ELECTRODE FILM

(75) Inventor: Takashi Kobayashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 118 days.

(21) Appl. No.: 12/329,528

(22) Filed: Dec. 5, 2008

(65) Prior Publication Data
US 2009/0189491 A1 Jul. 30, 2009

(30) Foreign Application Priority Data
Jan. 30, 2008 (JP) ................. 2008-018555

(51) Int. Cl.
*H01L 41/08* (2006.01)
*H03H 9/19* (2006.01)
(52) U.S. Cl. .................. 310/344; 310/348; 310/370
(58) Field of Classification Search .............. 310/344, 310/348, 370
See application file for complete search history.

(56) References Cited

U.S. PATENT DOCUMENTS

| 6,927,530 B2* | 8/2005 | Tanaya et al. ............. 310/370 |
| 7,352,117 B2* | 4/2008 | Kawanishi et al. ......... 310/370 |
| 7,553,609 B2* | 6/2009 | Aratake .................... 430/318 |
| 7,570,126 B2* | 8/2009 | Takahashi ................. 331/163 |
| 7,596,851 B2* | 10/2009 | Takahashi ................. 29/594 |
| 2005/0104481 A1* | 5/2005 | Sunaba et al. ............. 310/348 |
| 2007/0228897 A1* | 10/2007 | Umeki ..................... 310/370 |

FOREIGN PATENT DOCUMENTS
WO   WO 00-44092 A1   7/2000

* cited by examiner

Primary Examiner — Jaydi San Martin
(74) Attorney, Agent, or Firm — Brinks Hofer Gilson & Lione

(57) ABSTRACT

A piezoelectric vibrating reed includes a piezoelectric plate having a pair of vibrating arms provided parallel to each other, a base portion to integrally fix the pair of vibrating arms at a base end side thereof, and groove portions formed on both principal surfaces of the pair of vibrating arms in a constant length from base end portions toward tip end portions of the vibrating arms, and an electrode film formed of a base metal layer and a finishing metal layer laminated on outer surfaces of the piezoelectric plate and configured to vibrate the pair of vibrating arms when a predetermined voltage is applied thereon. The finishing metal layer of the electrode film is removed either partially or entirely at least in regions from the base end portions to the tip end portions of the vibrating arms.

9 Claims, 17 Drawing Sheets

ELECTRONIC DEVICE HAVING A PIEZOELECTRIC VIBRATING REED WITH A DISCONTINUOUS ELECTRODE FILM

RELATED APPLICATION

This application claims priority under 35 U.S.C. §119 to Japanese Patent Application No. JP2008-018555 filed on Jan. 30, 2008, the entire content of which is hereby incorporated by reference.

BACKGROUND OF THE INVENTION

1. Field of the Invention

The present invention relates to a tuning-fork piezoelectric vibrating reed, a piezoelectric vibrator having the piezoelectric vibrating reed, and an oscillator, an electronic device, and a wave clock each having the piezoelectric vibrator, as well as a manufacturing method of the piezoelectric vibrating reed.

2. Background Art

Recently, a piezoelectric vibrator utilizing quartz or the like is used in a cell-phone and a personal digital assistance as the time source, the timing source of a control signal, a reference signal source, and so forth. The piezoelectric vibrator of this type is proposed in a variety of forms, and a type having a tuning-fork piezoelectric vibrating reed is one example.

A tuning-fork piezoelectric vibrating reed includes a pair of vibrating arms disposed parallel to each other, a base portion to which a pair of the vibrating arms is integrally fixed at the base end side thereof, a pair of exciter electrodes formed on the outer surfaces of a pair of the vibrating arms to vibrate a pair of the vibrating arms, and mount electrodes electrically connected to a pair of the exciter electrodes, respectively. A pair of the exciter electrodes is an electrode that vibrates a pair of the vibrating arms at a specific resonance frequency in a direction to come close to or move apart from each other when a predetermined voltage is applied thereon via the mount electrodes. Both a pair of the exciter electrodes and the mount electrodes are electrode films formed by laminating a base metal layer and a finishing metal layer.

Incidentally, as is represented by a cell-phone, various electronic devices enclosing the piezoelectric vibrator are becoming smaller in recent years. Accordingly, there is a need for the piezoelectric vibrator to further reduce the size. Naturally, there is a need of a further size reduction for the piezoelectric vibrating reed forming the piezoelectric vibrator. Meanwhile, when the piezoelectric vibrating reed is reduced in size, it is general that the length of the vibrating arms becomes shorter.

The tuning-fork piezoelectric vibrating reed has a characteristic that the vibration characteristic deteriorates as the vibrating arms becomes shorter. A size reduction of the piezoelectric vibrating reed therefore gives rise to an inconvenience that the R1 value (serial resonance resistance value) becomes higher. In particular, because the R1 value is proportional to the effective resistance value Re, when the R1 value becomes higher, there arises a problem that it becomes difficult to operate the piezoelectric vibrating reed on low power.

When the tuning-fork piezoelectric vibrating reed is reduced in size, for example, groove portions are formed on the both principal surfaces of a pair of the vibrating arms along the longitudinal direction of the vibrating arms in order to lower the R1 value. For instance, WO00/44092 is an example of this art. The cross section of a piezoelectric vibrating reed provided with groove portions is shown in FIG. 26. As is shown in FIG. 26, a piezoelectric vibrating reed 200 has a pair of vibrating arms 202 each provided with groove portions 201 on the both principal surfaces. Owing to the groove portions 201, a pair of the vibrating arms 202 is formed in such a manner that each has a cross section in the shape of a letter H. Also, a pair of exciter electrodes 203 and 204 having different polarities is formed on the outer surfaces of a pair of the vibrating arms 202 by laminating a base metal layer 205 and a finishing metal layer 206.

According to the piezoelectric vibrating reed 200 configured as above, in particular, because the groove portions 201 are formed in the vibrating arms 202, a pair of the exciter electrodes 203 and 204 is in a positional relation to oppose each other to the extent possible. Hence, in comparison with a case where no groove portions 201 are formed, the electric field can act more efficiently. Accordingly, the vibration characteristic is improved because a vibration loss is lessened, and the R1 value can be as low as possible.

In order to achieve a size reduction of the piezoelectric vibrating reed while suppressing an increase of the R1 value, providing the groove portions as described above is effective.

As has been described, the electrode film forming a pair of the exciter electrodes 203 and 204 and the like is generally formed of two layers including the base metal layer 205 and the finishing metal layer 206. Normally, the base metal layer 205 is made of metal having a high hardness, such as chromium, in order to protect the piezoelectric vibrating reed 200. Meanwhile, the finishing metal layer 206 is made of soft metal having a low electric resistance value, such as gold, in order to enhance the ease of mounting and the conductivity with the lead terminals. It is general to use two kinds of metals made of different materials for the base metal layer 205 and the finishing metal layer 206 to suit different purposes.

Incidentally, the piezoelectric vibrating reed described above has the following problems that remain to be solved.

As has been described, it is effective to provide the groove portions in order to suppress the R1 value that increases with a size reduction of the piezoelectric vibrating reed. However, there is a processing limitation in forming a groove portion in the vibrating arm that has been made smaller. More specifically, because the vibrating arms themselves become smaller due to a size reduction, it is extremely difficult to form the groove portions in the vibrating arms that have been made smaller. Hence, there is a case that the piezoelectric vibrating reed fails to ensure a desired R1 value.

Under these circumstances, in order to ensure a constant R1 value, the size of the piezoelectric vibrating reed has to be increased up to a certain point.

SUMMARY OF THE INVENTION

The invention was devised in view of the forgoing and has an object to provide a tuning-fork piezoelectric vibrating reed capable of achieving a further size reduction while ensuring a constant R1 value, and a manufacturing method of a piezoelectric vibrating reed for manufacturing the piezoelectric vibrating reed described above.

The invention has another object to provide a piezoelectric vibrator having the piezoelectric vibrating reed described above as well as an oscillator, an electronic device, and a wave clock each having the piezoelectric vibrator.

In order to achieve the above and other objects, the invention provides the following configurations.

A piezoelectric vibrating reed according to one aspect of the invention includes a piezoelectric plate having a pair of vibrating arms provided parallel to each other, a base portion to integrally fix the pair of vibrating arms at a base end side thereof, and groove portions formed on both principal surfaces of the pair of vibrating arms in a constant length from base end portions toward tip end portions of the vibrating arms, and an electrode film formed of a base metal layer and a finishing metal layer laminated on outer surfaces of the piezoelectric plate and configured to vibrate the pair of vibrating arms when a predetermined voltage is applied thereon, wherein the finishing metal layer of the electrode film is removed either partially or entirely at least in regions from the base end portions to the tip end portions of the vibrating arms.

Also, a manufacturing method of a piezoelectric vibrating reed according to another aspect of the invention is a method of manufacturing a plurality of piezoelectric vibrating reeds at a time using a wafer made of a piezoelectric material, which includes an outer shape forming step of patterning outer shapes on the wafer for forming a plurality of piezoelectric plates each having a pair of vibrating arms provided parallel to each other and a base portion to integrally fix the pair of vibrating arms at a base end side thereof by etching the wafer using a photolithographic technique, a groove portion forming step of forming groove portions having a constant length from base end portions toward tip end portions of the vibrating arms on both principal surfaces of the pair of vibrating arms of each of a plurality of the piezoelectric plates, an electrode forming step of forming an electrode film that vibrates the pair of vibrating arms when a predetermined voltage is applied thereon by laminating a base metal layer and a finishing metal layer on outer surfaces of a plurality of the piezoelectric plates, and a cutting step of separating a plurality of the piezoelectric plates off from the wafer in the form of small pieces, wherein, in the electrode forming step, the finishing metal layer is removed either partially or entirely at least in regions from the base end portions to the tip end portions of the vibrating arms.

According to the piezoelectric vibrating reed and the manufacturing method of a piezoelectric vibrating reed of the invention, the outer shape forming step of patterning the outer shapes of a plurality of piezoelectric plates on the wafer is performed first by etching the wafer made of a piezoelectric material, such as quartz, using the photolithographic technique. In this instance, each piezoelectric plate is formed to have a pair of vibrating arms disposed parallel to each other and a base portion that integrally fixes the pair of vibrating arms at the base end side. Subsequently, the groove portion forming step of forming the groove portions on the both principal surfaces of the pair of vibrating arms of each of a plurality of piezoelectric plates is performed. In this instance, the groove portions of a constant length are formed from the base end portions toward the tip end portions of the vibrating arms. Subsequently, the electrode forming step of forming the electrode film that vibrates the pair of vibrating arms when a predetermined voltage is applied thereon on the outer surfaces of each of a plurality of the piezoelectric plates is performed. In this instance, the electrode film is formed by laminating the base metal layer and the finishing metal layer. Subsequently, the cutting step of separating a plurality of the piezoelectric plates off from the wafer in the form of small pieces is performed. It thus becomes possible to manufacture a plurality of piezoelectric vibrating reeds, on each of the outer surfaces of the piezoelectric plate of which the electrode film is formed, from a single wafer at a time.

In particular, in the electrode forming step, the base metal layer and the finishing metal layer are not laminated across the entire outer surfaces of the piezoelectric plate, and instead, the electrode film is formed in such a manner that the finishing metal layer is removed either partially or entirely at least in the region from the base end portions to the tip end portions of the vibrating arms. The electrode film formed on the vibrating arms is therefore a single-layer film formed of the base metal layer alone either partially or entirely. It thus becomes possible to lessen the film thickness of the electrode film coated on the vibrating arms.

Incidentally, when the electrode film is formed, film stress acts on the piezoelectric plate. Deformation is thus increased in the piezoelectric plate due to the film stress and the vibration characteristic varies. The R1 value thus tends to become higher. In particular, the R1 value tends to become higher with an increase of the film thickness.

However, as has been described above, because the film thickness of the electrode film coated on the vibrating arms can be lessened, it becomes possible to reduce the R1 value in comparison with the one in the related art. The R1 value can be therefore reduced by a method other than the processing of the groove portions.

Hence, even when the piezoelectric vibrating reed is made smaller than the size that is determined by the limitation of the groove portion processing in order to ensure a constant R1 value, it is possible to suppress an increase of the R1 value by adjusting the film thickness of the electrode film. It thus becomes possible to manufacture the piezoelectric vibrating reed further reduced in size while ensuring the constant R1 value.

Moreover, because the electrode film is merely made as a single-layer film formed of the base metal layer alone either partially or entirely, the electrode film as described above can be formed without using any complex shape or special means. The piezoelectric vibrating reed can be therefore manufactured efficiently at a low cost.

Because the single-layer film is provided on the vibrating arms side, the finishing metal layer of the electrode film remains on the base end side as in the related art. The ease of mounting and the conductivity therefore remain the same.

In the piezoelectric vibrating reed of the invention, the finishing metal layer of the electrode film is removed either partially or entirely from the base end portions to positions spaced by at least the constant length.

In the manufacturing method of a piezoelectric vibrating reed of the invention, in the electrode forming step, the finishing metal layer is removed either partially or entirely from the base end portions to positions spaced by at least the constant length.

According to the piezoelectric vibrating reed and the manufacturing method of a piezoelectric vibrating reed of the invention, in the electrode forming step, the finishing metal layer is removed either partially or entirely from the base end portions to positions spaced by at least the constant length. In other words, the electrode film coated on the region where the groove portions are formed in the vibrating arms is a single-layer film formed of the base metal layer alone, either partially or entirely, so that the film thickness is lessened.

In particular, because the shape is complex in the regions where the groove portions are formed, the film thickness varies in comparison with a case where the electrode film is simply formed on a flat surface and irregularities readily occur. Film stress therefore readily acts thereon and deformation is increased easily.

However, because the electrode film is a single-layer film either partially or entirely in the regions where the groove portions are formed, it is possible to reduce the film stress and the load of deformation that act on the piezoelectric plate. Hence, the R1 value can be reduced more effectively and a further size reduction can be achieved.

In the piezoelectric vibrating reed of the invention, the finishing metal layer of the electrode film is removed from the both principal surfaces and inside the groove portions of the piezoelectric plate.

In the manufacturing method of a piezoelectric vibrating reed of the invention, in the electrode forming step, the finishing metal layer is removed from the both principal surfaces and inside the groove portions of the piezoelectric plate.

According to the piezoelectric vibrating reed and the manufacturing method of a piezoelectric vibrating reed of the invention, in the electrode forming step, the finishing metal layer is removed from the both principal surfaces and inside the groove portions of the piezoelectric plate. More specifically, the electrode film is formed in such a manner that it is a single-layer film formed of the base metal layer alone inside the entire groove portions and it is also a single-layer film formed of the base metal layer alone on the entire both surfaces of the vibrating arms at least in the regions where the groove portions are formed.

In particular, because the single-layer film formed of the base metal layer alone is provided inside the groove portions where the film thickness readily becomes irregular, the R1 value can be reduced more effectively.

In the piezoelectric vibrating reed of the invention, the base metal layer is made of chromium and the finishing metal layer is made of gold.

In the manufacturing method of a piezoelectric vibrating reed of the invention, in the electrode forming step, the base metal layer is made of chromium and the finishing metal layer is made of gold.

According to the piezoelectric vibrating reed and the manufacturing method of a piezoelectric vibrating reed of the invention, in the electrode film forming step, the base metal layer is made of chromium and the finishing metal layer is made of gold.

Because chromium has high hardness, it is possible to protect the piezoelectric vibrating reed itself when chromium is used for the base metal layer. Also, because gold is soft and has a low electric resistance value, it is possible to increase the ease of mounting and the conductivity when the piezoelectric vibrating reed is mounted on the lead terminals when gold is used for the finishing metal layer.

In other words, by using chromium and gold for the base metal layer and the finishing metal layer, respectively, not only can the piezoelectric vibrating reed be protected, but also the electrical conductivity can be ensured safely. It thus becomes possible to enhance the quality of the piezoelectric vibrating reed.

A piezoelectric vibrator according to still another aspect of the invention includes the piezoelectric vibrating reed of the invention as above.

According to the piezoelectric vibrator of the invention, because it includes the piezoelectric vibrating reed as above, it is possible to ensure the constant R1 value while the piezoelectric vibrator is reduced in size. The quality of the piezoelectric vibrator can be thus enhanced.

An oscillator according to still another aspect of the invention includes the piezoelectric vibrator of the invention as above, which is electrically connected to an integrated circuit as a resonator.

An electronic device according to still another aspect of the invention includes the piezoelectric vibrator of the invention as above, which is electrically connected to a clock portion.

A wave clock according to still another aspect of the invention includes the piezoelectric vibrator of the invention as above, which is electrically connected to a filter portion.

According to the oscillator, the electronic device, and the wave clock of the invention, because each includes the piezoelectric vibrator as above, the size can be reduced and the quality can be enhanced as with the piezoelectric vibrator.

DETAILED DESCRIPTION OF THE PREFERRED EMBODIMENTS

Hereinafter, one embodiment of the invention will be described with reference to FIG. 1 through FIG. 21. This embodiment will describe a piezoelectric vibrator 1, which is a cylinder package type piezoelectric vibrator, by way of example.

As are shown in FIG. 1 through FIG. 6, the piezoelectric vibrator 1 of this embodiment includes a piezoelectric vibrating reed 2, a case 3 that accommodates the piezoelectric vibrating reed 2 inside, and a plug 4 that is an airtight terminal to hermetically seal the piezoelectric vibrating reed 2 inside the case 3.

Figure 3:
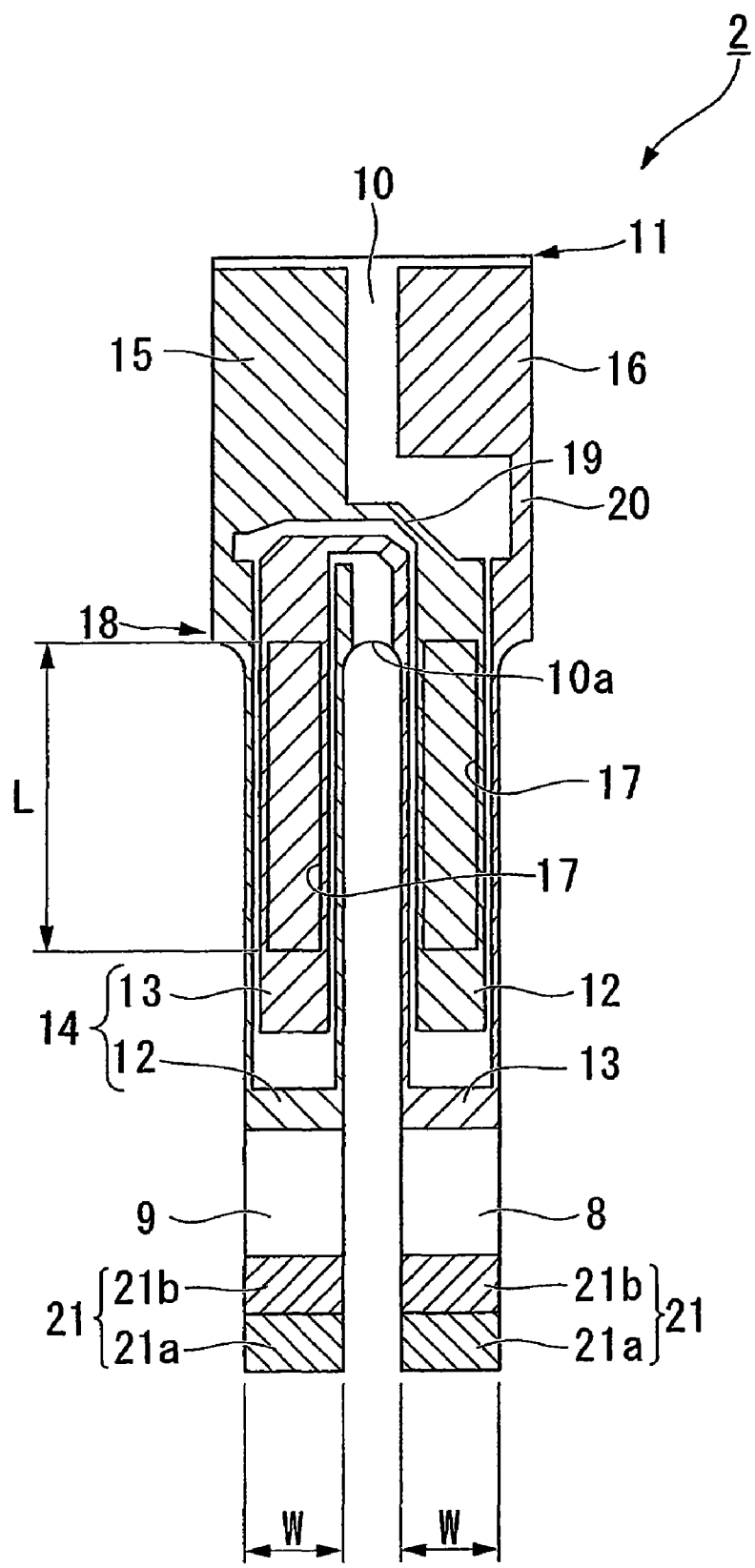
FIG. 3 is a view of the piezoelectric vibrating reed shown in FIG. 1 when viewed from below.
Figure 4:
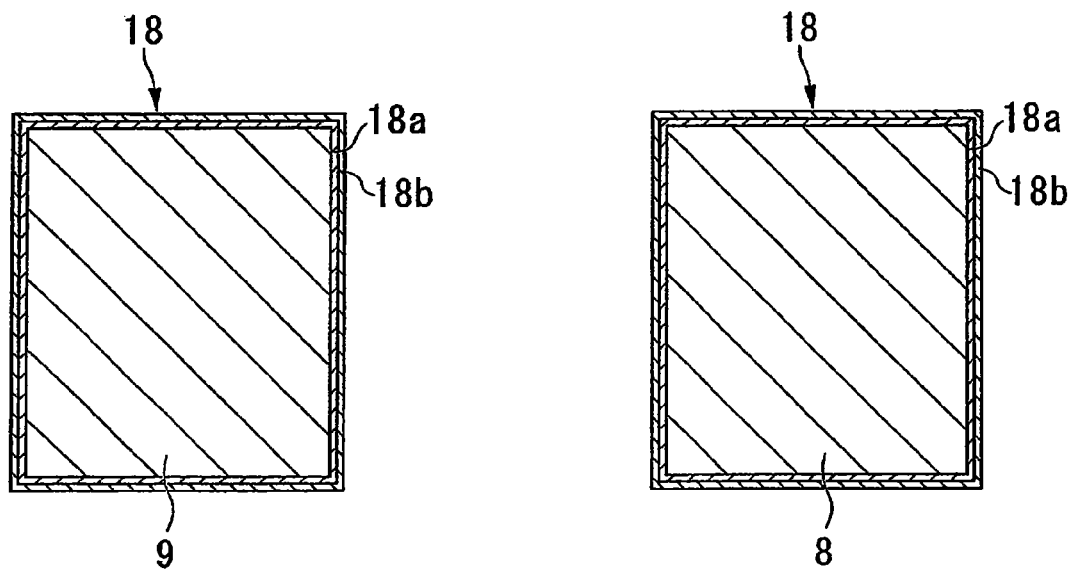
FIG. 4 is a cross section of the piezoelectric vibrating reed taken on line A-A of FIG. 2.
Figure 5:
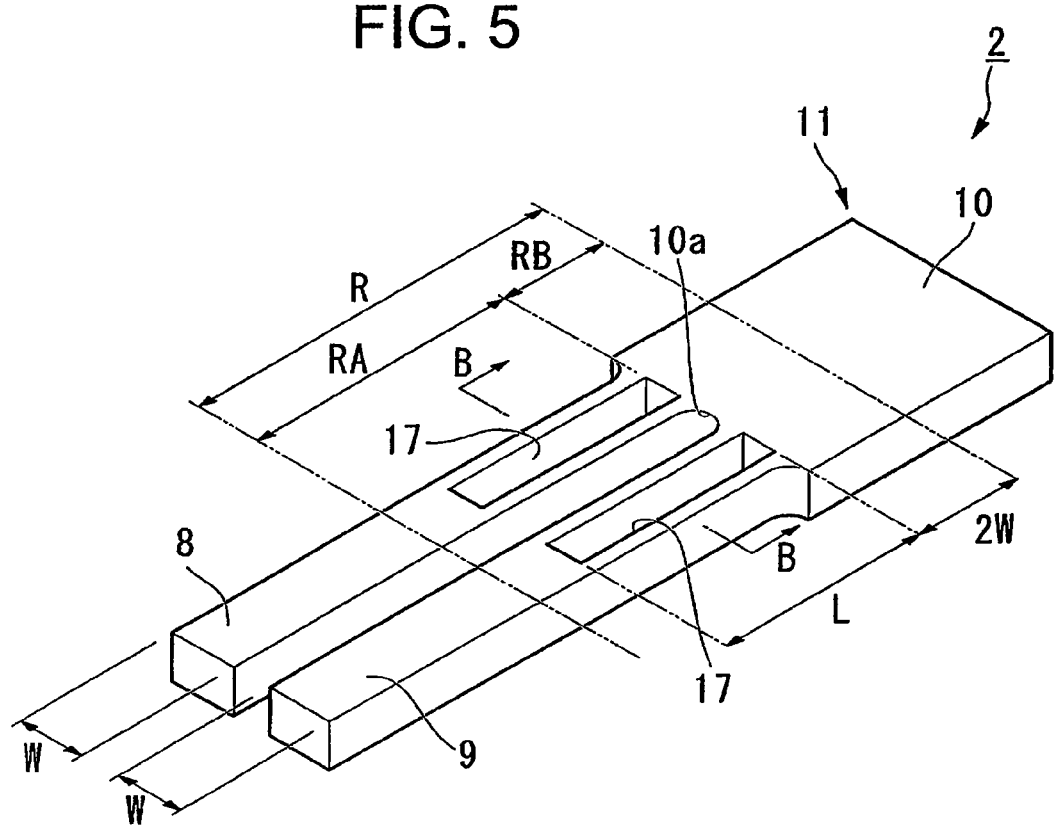
FIG. 5 is perspective view of the piezoelectric vibrating reed shown in FIG. 1.

As are shown in FIG. 2 through FIG. 6, the piezoelectric vibrating reed 2 is a tuning-fork vibrating reed made of a piezoelectric material, such as quartz, lithium tantalate, and lithium niobate, and vibrates when a predetermined voltage is applied thereon. In FIG. 5, an electrode film 18 and a weight metal film 21 described below are omitted.

Figure 2:
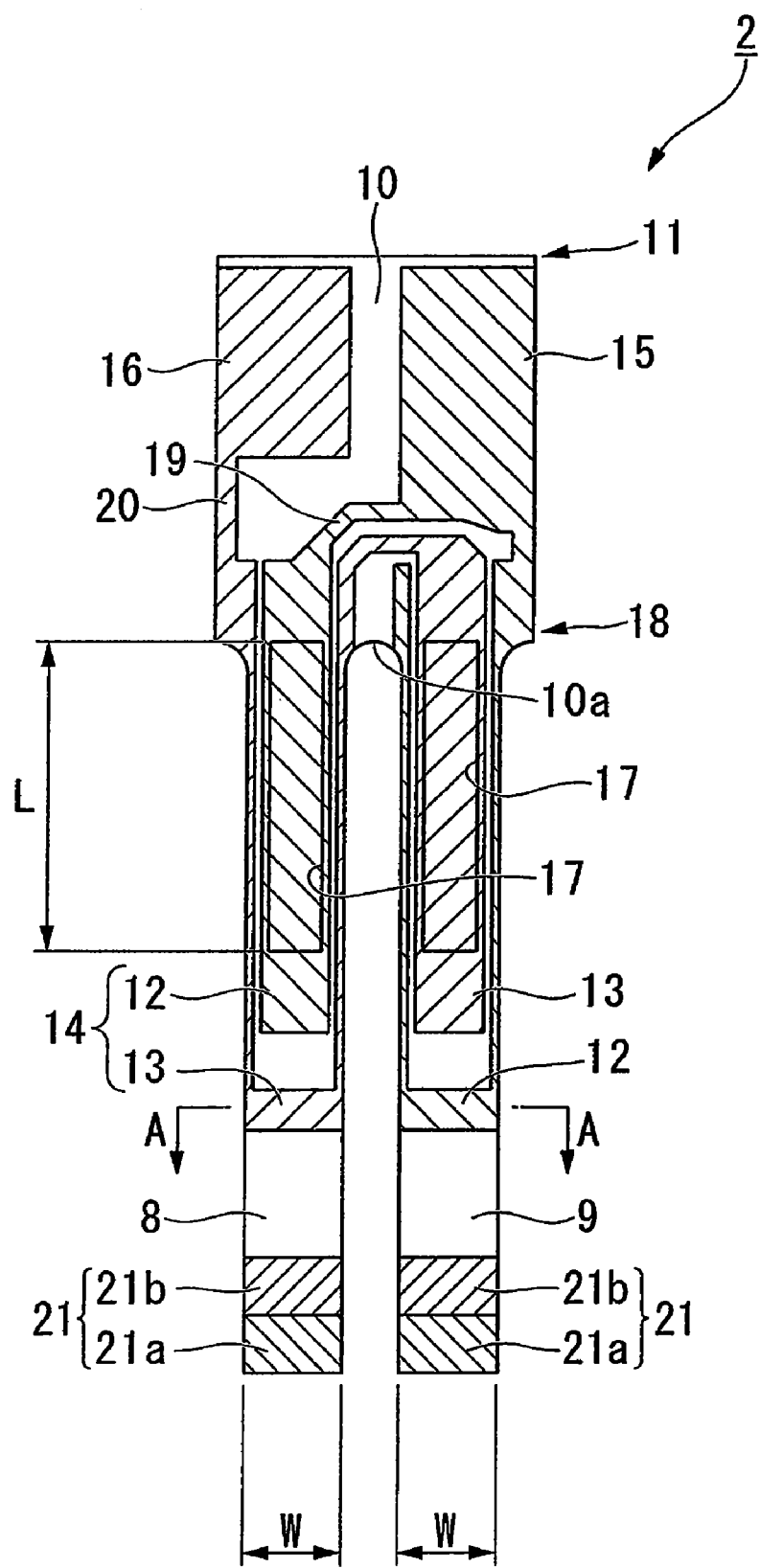
FIG. 2 is a view of the piezoelectric vibrating reed shown in FIG. 1 when viewed from above.

As are shown in FIG. 2 and FIG. 3, the piezoelectric vibrating reed 2 includes a piezoelectric plate 11 having a pair of vibrating arms 8 and 9 disposed parallel to each other and a base portion 10 that integrally fixes a pair of the vibrating arms 8 and 9 at the base end side thereof, an exciter electrode 14 formed of a first exciter electrode 12 and a second exciter electrode 13 that are formed on the outer surfaces of a pair of the vibrating arms 8 and 9 and vibrate a pair of the vibrating arms 8 and 9, mount electrodes 15 and 16 electrically connected to the first exciter electrode 12 and the second exciter electrode 13, respectively.

In addition, the piezoelectric vibrating reed 2 of this embodiment includes groove portions 17 formed in a constant length L from the base end portions toward the tip end portions of the vibrating arms 8 and 9 on the both principal surfaces of a pair of the vibrating arms 8 and 9. The groove portions 17 are formed from the base end portions to almost the intermediate points of the vibrating arms 8 and 9. The arm widths of a pair of the vibrating arms 8 and 9 are the same, which is referred to as W. Also, a part of the base portion 10 connected to the base end portions of a pair of the vibrating arms 8 and 9 is referred to as the crotch portion 10a.

The exciter electrode 14 formed of the first exciter electrode 12 and the second exciter electrode 13 is an electrode that vibrates a pair of the vibrating arms 8 and 9 at a specific resonance frequency in a direction to come close to or move apart from each other, and is formed through patterning on the outer surfaces of a pair of the vibrating arms 8 and 9 in such a manner that the first exciter electrode 12 and the second exciter electrode 13 are in an electrically isolated state. To be more concrete, as is shown in FIG. 2, the first exciter electrode 12 is formed on the groove portions 17 in one vibrating arm 8 and on the both side surfaces of the other vibrating arm 9, whereas the second exciter electrode 13 is formed on the both side surfaces of one vibrating arm 8 and on the groove portions 17 in the other vibrating arm 9.

As are shown in FIG. 2 and FIG. 3, the first exciter electrode 12 and the second exciter electrode 13 are electrically connected to the mount electrodes 15 and 16 via extraction electrodes 19 and 20, respectively, on the both principal surfaces of the base portion 10. It is configured in such a manner that a voltage is applied to the piezoelectric vibrating reed 2 via the mount electrodes 15 and 16.

More specifically, the exciter electrode 14, the mount electrodes 15 and 16, and the extraction electrodes 19 and 20 function as an electrode film 18 that vibrates a pair of the vibrating arms 8 and 9 when a predetermined voltage is applied thereon.

As is shown in FIG. 4, the electrode film 18 is formed in a state where two layers, a base metal layer 18a and a finishing metal layer 18b, are laminated. In this embodiment, chromium is used for the base metal layer 18a and gold is used for the finishing metal layer 18b. It should be appreciated, however, that the materials are not limited to those specified above, and coating may be provided by a conductive film made, for example, of nickel (Ni), aluminum (Al), or titanium (Ti).

Figure 6:
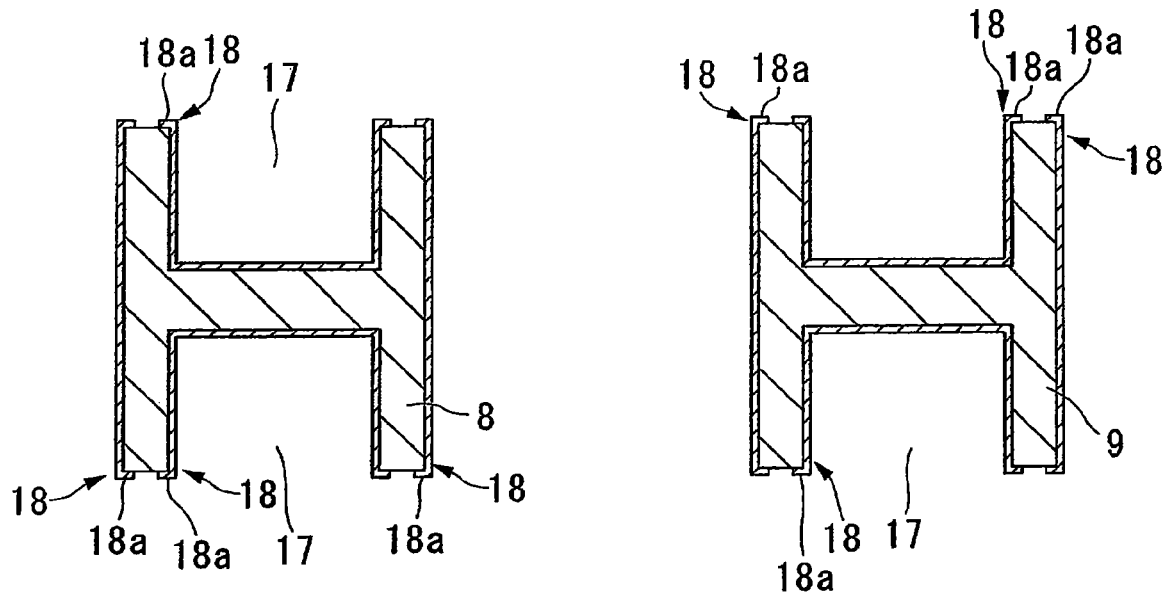
FIG. 6 is a cross section of the piezoelectric vibrating reed taken on line B-B of FIG. 5.

Regarding the electrode film 18, as is shown in FIG. 5, the finishing electrode layer 18b is removed either partially or entirely at least in regions from the base end portions to the tip end portions of the vibrating arms 8 and 9. More specifically, as is shown in FIG. 6, on the side from the base end portions to the tip end portions of the vibrating arms 8 and 9, the finishing metal layer 18b is removed entirely from the base end portions to positions spaced by at least the constant length L (region RA of FIG. 5). Further, on the side from the base end portions of the vibrating arms 8 and 9 to the base portion 10, the finishing metal layer 18b is removed entirely from the base end portions toward the base portion 10 to positions spaced by two times the arm width W of the vibrating arms 8 and 9 (region RB of FIG. 5).

In short, the electrode film 18 is a single-layer film formed of the base metal layer 18a alone entirely including the inside of the groove portions 17 in the region RA and the region RB of the vibrating arms 8 and 9 including the regions where the groove portions 17 are formed. Hereinafter, the region RA and the region RB are collectively referred to as the single-layer region R.

As are shown in FIG. 2 and FIG. 3, a pair of the vibrating arms 8 and 9 is coated with a weight metal film 21 at the tip ends for adjusting their own vibration states (tuning the frequency) in such a manner as to vibrate within a specific frequency range. The weight metal film 21 is divided into a rough tuning film 21a used when the frequency is tuned roughly and a fine tuning film 21b used when the frequency is tuned finely. By tuning the frequency with the use of these rough tuning film 21a and fine tuning film 21b, the frequency of a pair of the vibrating arms 8 and 9 can be set to fall within a range of the nominal frequency of the device.

Figure 1:
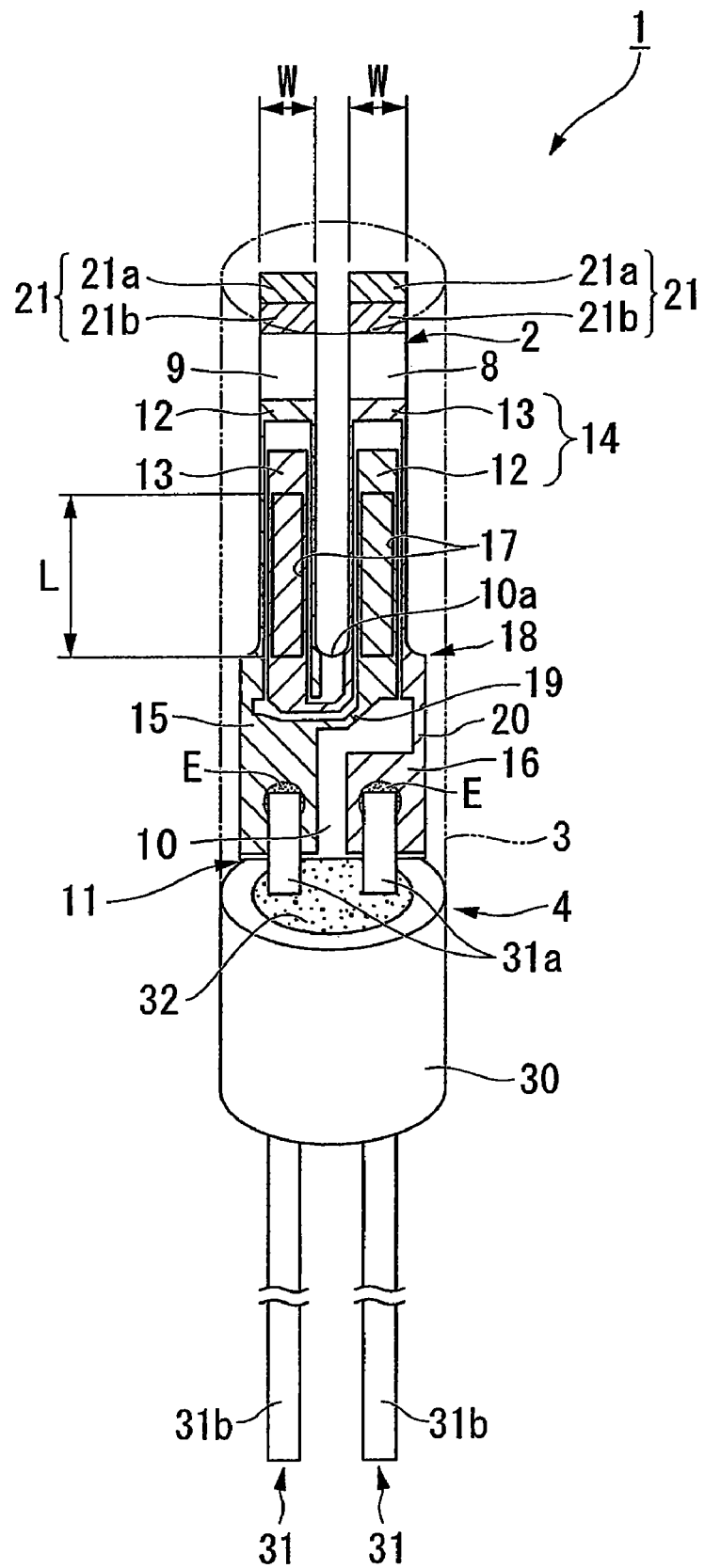
FIG. 1 is a view showing the inside of the case of a piezoelectric vibrator according to one embodiment of the invention when a piezoelectric vibrating reed is viewed in a plane.

As is shown in FIG. 1, the case 3 is formed in the shape of a bottomed cylinder. It is press-fit to the outer circumference of the stem 30 of the plug 4 described below with the piezoelectric vibrating reed 2 being accommodated therein and is thereby fit fixedly. Press-fitting of the case 3 is carried out under vacuum atmosphere and a space surrounding the piezoelectric vibrating reed 2 inside the case 3 is in a state maintained under vacuum.

The plug 4 has the stem 30 to hermetically seal the interior of the case 3, two lead terminals 31 disposed parallel to each other to penetrate through the stem 30 and serving as inner leads 31a, on one end side, onto which is mounted (mechanically joined and electrically connected) the piezoelectric vibrating reed 2 with the stem 30 in between and serving as outer leads 31b, on the other end side, to be electrically connected to the outside, and an insulating filling material 32 filled inside the stem 30 to fix the stem 30 and the lead terminals 31.

The stem 30 is made of a metal material in an annular shape. The filling material 32 is made, for example, of borosilicate glass. It should be noted that the surface of the lead terminals 31 and the outer circumference of the stem 30 are coated with unillustrated plating made of the same material.

Regarding the two lead terminals 31, portions protruding inside the case 3 serve as the inner leads 31a and portions protruding to the outside of the case 3 serve as the outer leads 31b. The inner leads 31a and the mount electrodes 15 and 16 are mounted via conductive bumps E. More specifically, the inner leads 31a and the mount electrodes 15 and 16 are mechanically joined to each other via the bumps E and electrically connected at the same time. The piezoelectric vibrating reed 2 is consequently brought into a state where it is mounted on the two lead terminals 31.

The two lead terminals 31 are electrically connected to the outside at one end side thereof (outer leads 31b side) and function as the external connection terminals to be mounted on the piezoelectric vibrating reed 2 at the other end side thereof (inner leads 31a side).

One example of the dimension and the material of chief components forming the plug 4 will now be described.

The diameter of the lead terminals 31 is, for example, about 0.12 mm and Kovar (FeNiCo alloy) is normally used as the base material of the lead terminals 31. As materials of plating coated on the outer surfaces of the lead terminals 31 and the outer circumference of the stem 30, Cu is used for the base film and heat-resistant solder plating (alloy of tin and lead with the weight ratio of 1:9), silver (Ag), and tin-copper alloy (SnCu), gold-tin alloy (AuSn), and so forth are used for the finishing film.

Also, by cold-welding the stem 30 to the inner circumference of the case 3 under vacuum by interposing the metal film (plating film) coated on the outer circumference of the stem 30, the interior of the case 3 can be hermetically sealed under vacuum.

In a case where the piezoelectric vibrator 1 configured in this manner is operated, a predetermined drive voltage is applied to the outer leads 31b of the two lead terminals 31. A current is then flown into the exciter electrode 14 formed of the first exciter electrode 12 and the second exciter electrode 13 via the inner leads 31a, the bumps E, the mount electrodes 15 and 16, and the extraction electrodes 19 and 20, which allows a pair of the vibrating arms 8 and 9 to vibrate at a specific frequency in a direction to come close to and move apart from each other. By utilizing the vibration of a pair of the vibrating arms 8 and 9, the piezoelectric vibrator 1 can be used as the time source, the timing source of a control signal, the reference signal source, and so forth.

Figure 7:
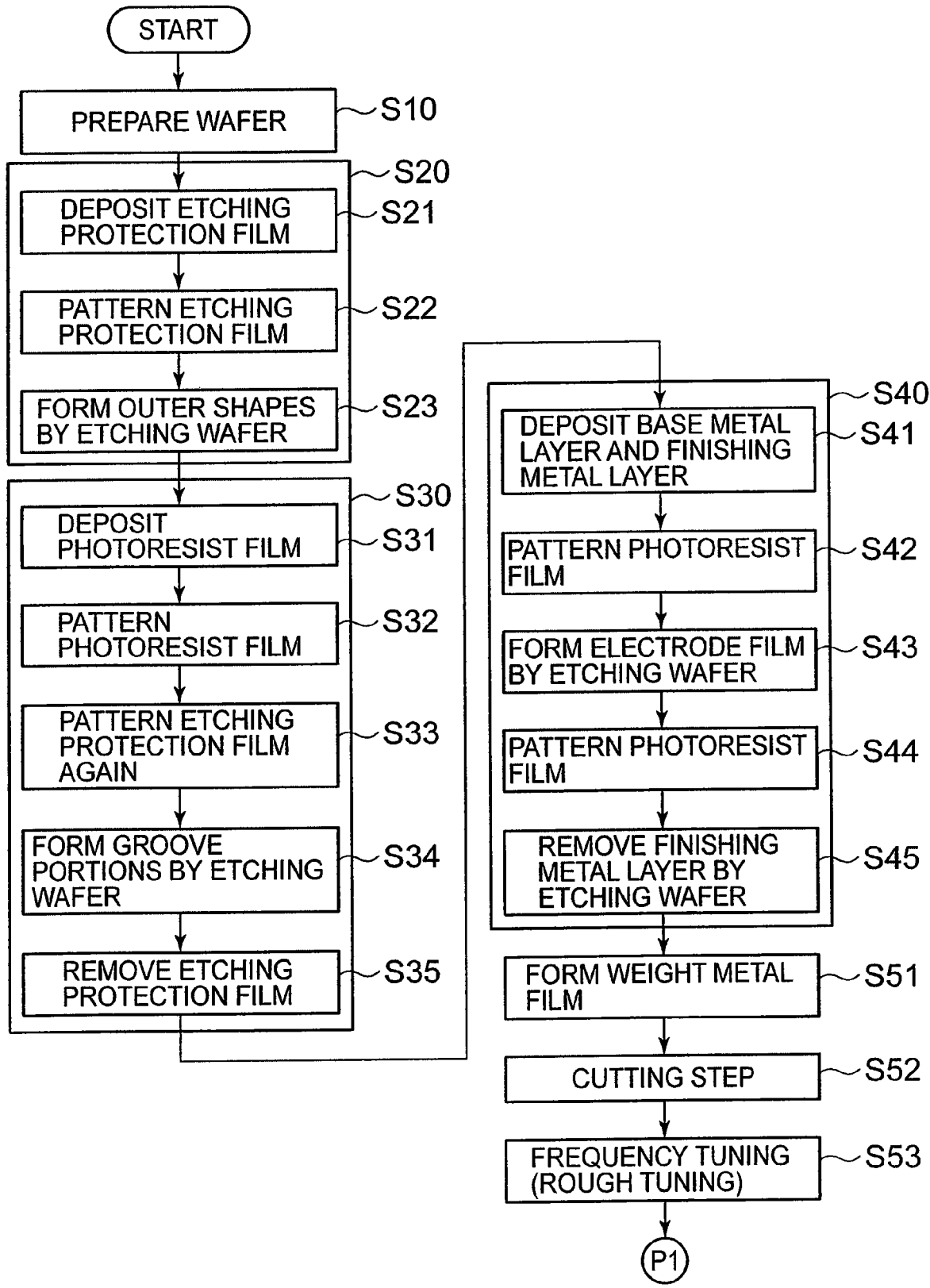
FIG. 7 a flowchart when the piezoelectric vibrator shown in FIG. 1 is manufactured.
Figure 8:
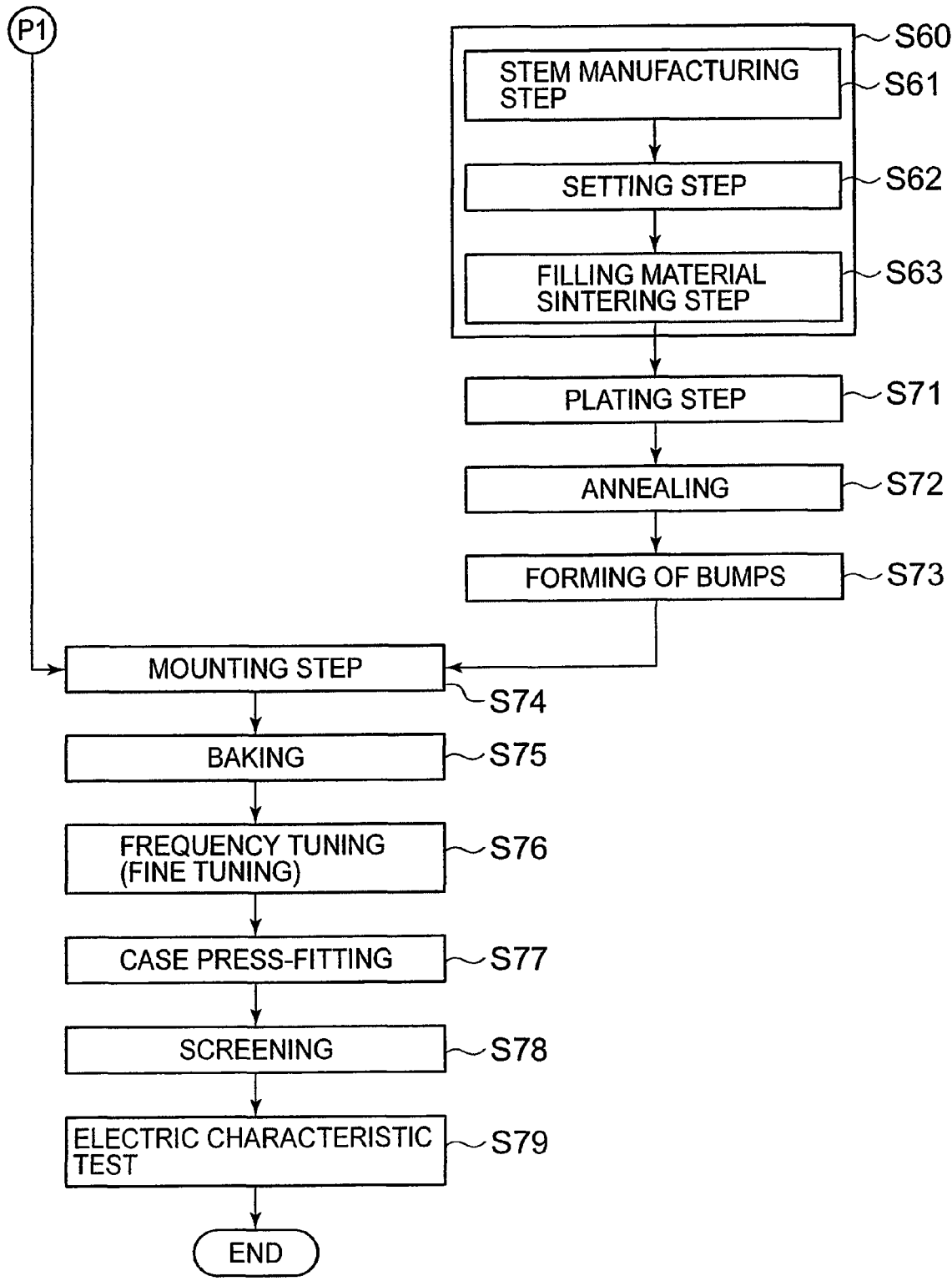
FIG. 8 is a flowchart continued from the flowchart in FIG. 7.

A method of manufacturing a plurality of the piezoelectric vibrators 1 described above at a time will now be described with reference to the flowcharts shown in FIG. 7 and FIG. 8.

To be more concrete, a Lambert raw stone of quartz is sliced at a predetermined angle to form a wafer S having a constant thickness. Subsequently, the wafer S is wrapped and subjected to rough processing, after which the affected layer is removed by etching followed by mirror grinding processing, such as polishing. The wafer S having a predetermined thickness is thus prepared (S10).

Subsequently, the outer shape forming step of patterning the outer shapes of a plurality of the piezoelectric vibrating reeds 2 is performed by etching the polished wafer S using the photolithographic technique (S20). This step will be described more concretely.

Figure 9:
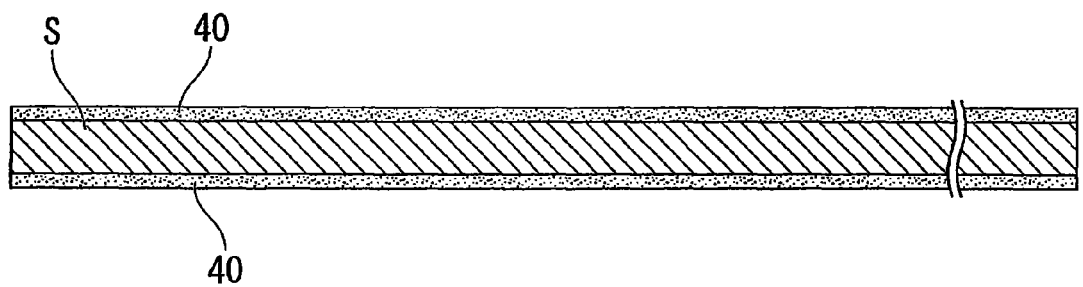
FIG. 9 is a view showing one step when the piezoelectric vibrator shown in FIG. 1 is manufactured in a state where an etching protection film is formed on the both surfaces of a wafer.
Figure 10:
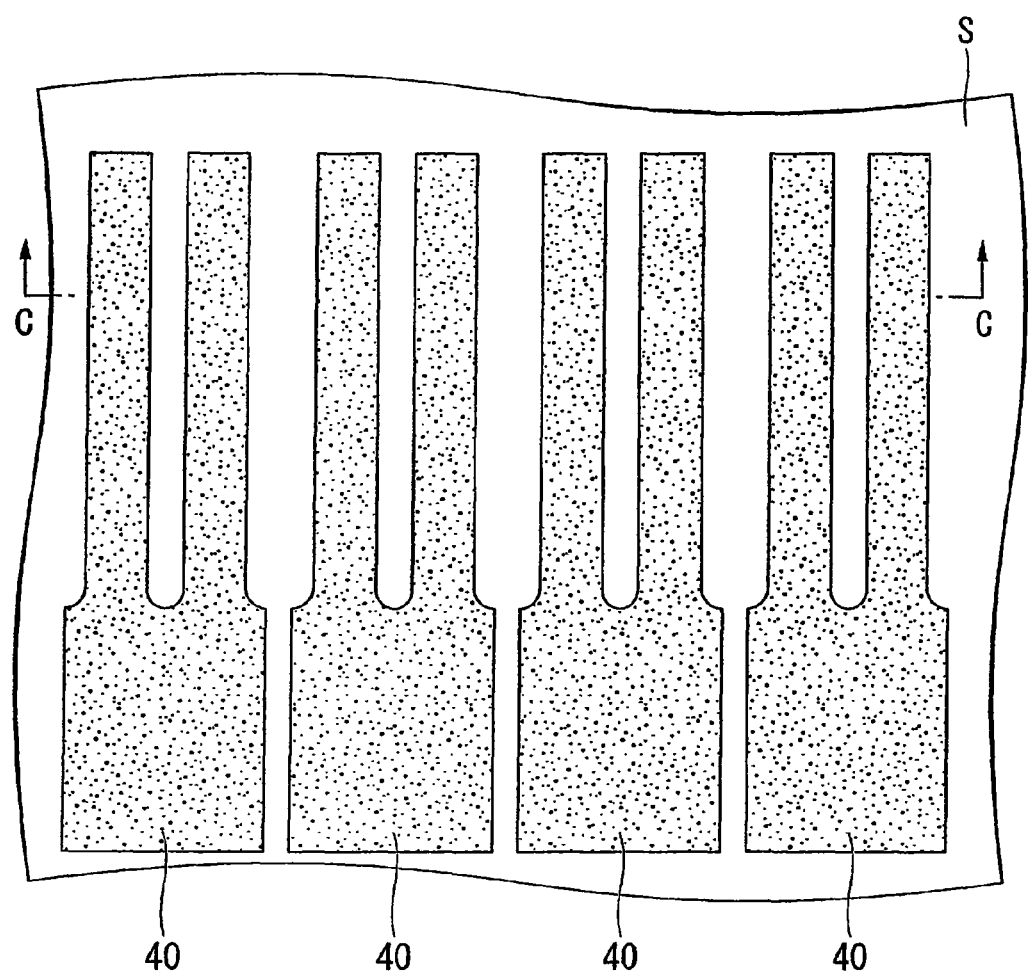
FIG. 10 is a view showing a state where the outer shapes of piezoelectric plates of the piezoelectric vibrating reed are patterned on the etching protection film from the state shown in FIG. 9.
Figure 11:
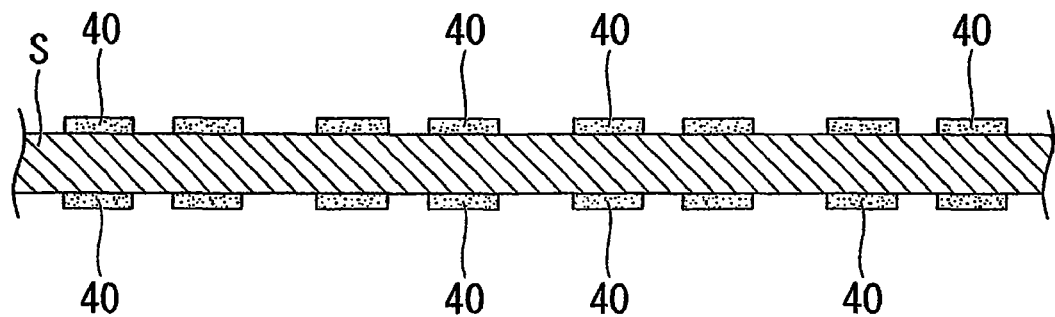
FIG. 11 is a cross section taken on line C-C of FIG. 10.

Initially, after the wafer S having finished with polishing is prepared, as is shown in FIG. 9, an etching protection film 40 is deposited on the both surfaces of the wafer S (S21). As the etching protection film 40, for example, a film of chromium (Cr) having a thickness of about several μm is deposited. Subsequently, an unillustrated photoresist film is patterned on the etching protection film 40 using the photolithographic technique. In this instance, the photoresist film is patterned so as to surround the periphery of each piezoelectric vibrating reed 2. The etching is performed using the photoresist film as a mask, so that unmasked regions of the etching protection film 40 are selectively removed. The photoresist film is removed after the etching. Consequently, as are shown in FIG. 10 and FIG. 11, the etching protection film 40 is patterned to the shape described above (S22). In short, the etching protection film 40 can be patterned along the outer shapes of the piezoelectric vibrating reeds 2, that is, the outer shapes of a pair of the vibrating arms 8 and 9 and the base portion 10. In this instance, as many outer shapes as a plurality of the piezoelectric vibrating reeds 2 are patterned. FIG. 11 through FIG. 16 are views showing the cross sections taken on line C-C of FIG. 10.

Figure 12:
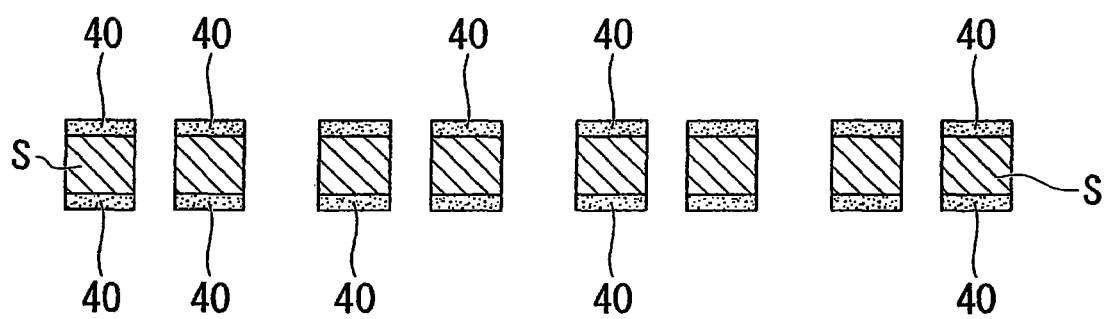
FIG. 12 is a view showing a state where the wafer is etched using the etching protection film as a mask from the state shown in FIG. 11.

Subsequently, the both surfaces of the wafer S are etched using the patterned etching protection film 40 as a mask (S23). Accordingly, as is shown in FIG. 12, the outer shape of the piezoelectric vibrating reed 2 can be formed by selectively removing regions unmasked by the etching protection film 40. The outer shape forming step ends at this point. A plurality of the piezoelectric vibrating reeds 2 remain in a state where they are connected to the wafer S via unillustrated connection portions until the cutting step is performed later.

Subsequently, the groove portion forming step of forming the groove portions 17 in a pair of the vibrating portions 8 and 9 is performed before the electrode forming step (S30). This step will be described more concretely.

Figure 13:
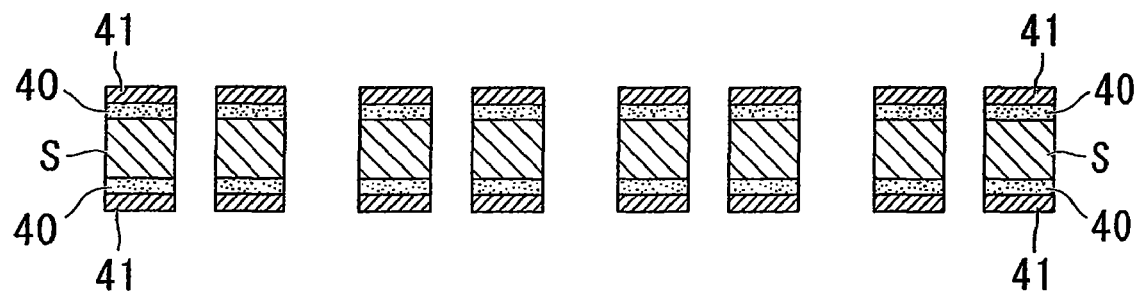
FIG. 13 is a view showing a state where a photoresist mask is patterned from the state shown in FIG. 12.
Figure 14:
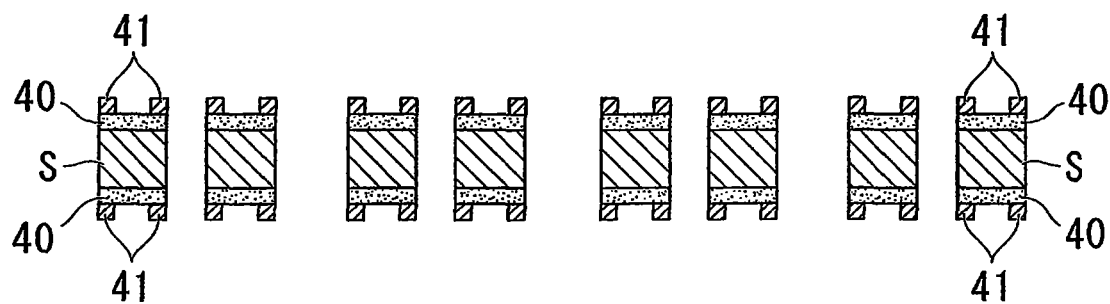
FIG. 14 is a view showing a state where a part of the photoresist film is removed using the photolithographic technique from the state shown in FIG. 13.
Figure 15:
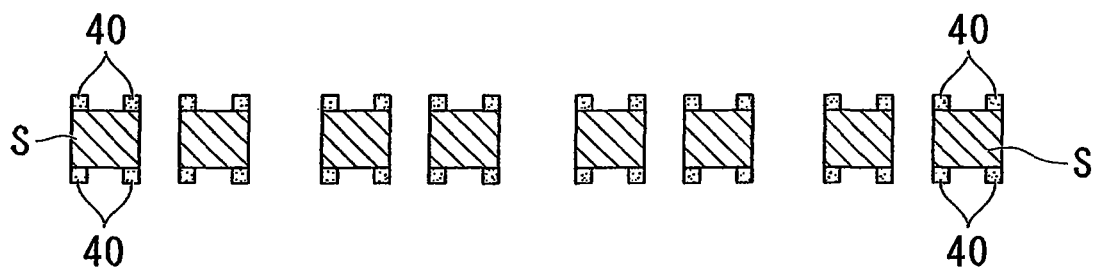
FIG. 15 is a view showing a state where the wafer is etched using the photoresist film as a mask from the state shown in FIG. 14.

Initially, as is shown in FIG. 13, a photoresist film 41 is deposited on the etching protection film 40 by means of spray coating or the like (S31). The photoresist film 41 is then patterned using the photolithographic technique. In this instance, as is shown in FIG. 14, the photoresist film 41 is patterned along the outer shapes of the piezoelectric vibrating reeds 2 in a state where spaces are left in regions corresponding to the groove portions 17 (S32). The etching is then performed using the photoresist film 41 thus patterned as a mask and unmasked regions of the etching protection film 40 are selectively removed. The photoresist film 41 is removed after the etching. Consequently, as is shown in FIG. 15, the etching protection film 40 that has been already patterned can be further patterned in a state where spaces are left in the regions corresponding to the groove portions 17 (S33).

Figure 16:
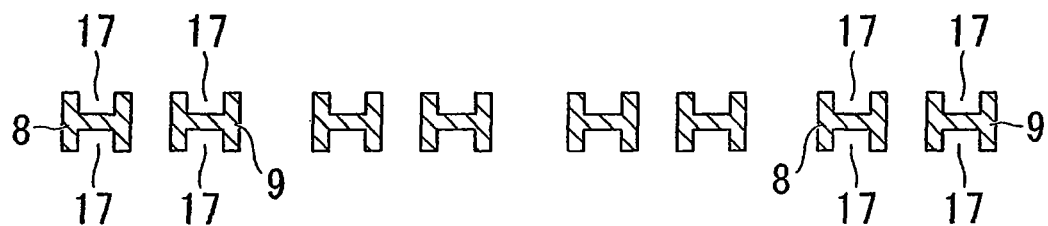
FIG. 16 is a view showing a state where the wafer is etched using the etching protection film as a mask from the state shown in FIG. 15.

Subsequently, the wafer S is etched using the etching protection film 40 patterned again as a mask (S34), after which the etching protection film 40 used as the mask is removed (S35). Consequently, as is shown in FIG. 16, the groove portions 17 can be formed in a pair of the vibrating arms 8 and 9. The groove forming step ends at this point.

Subsequently, the electrode forming step of forming the electrode film 18 (the exciter electrode 14, the extraction electrodes 19 and 20, and the mount electrodes 15 and 16) that vibrates a pair of the vibrating arms 8 and 9 when a predetermined voltage is applied thereon is performed by laminating the base metal layer 18a and the finishing metal layer 18b on the outer surfaces of a plurality of piezoelectric plates 11 (S40).

Figure 17:
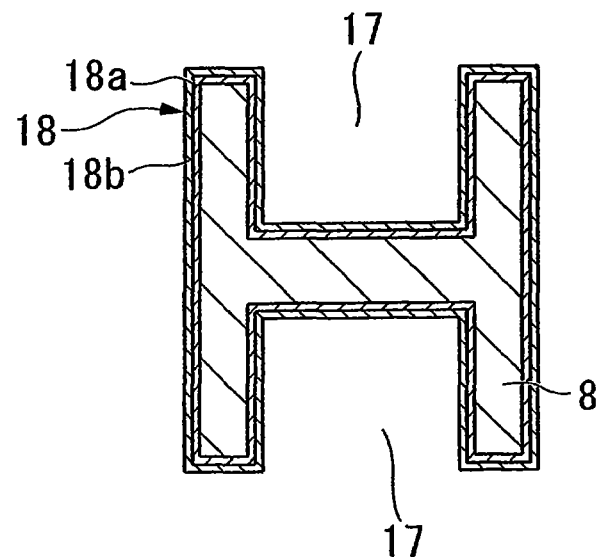
FIG. 17 is an enlarged view of one of vibrating arms shown in FIG. 16 to show a state where it is coated with a base metal layer and a finishing metal layer from the state shown in FIG. 16.

Initially, as is shown in FIG. 17, the base metal layer 18a and the finishing metal layer 18b are deposited at positions at which the electrode film 18 is to be formed by means of vapor deposition, sputtering, or the like (S41). FIG. 17 through FIG. 21 show one vibrating arm 8 alone of the piezoelectric plate 11.

Figure 18:
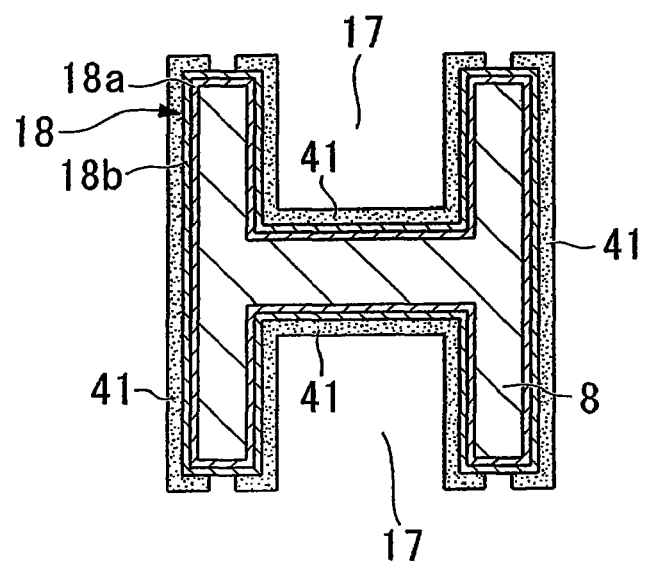
FIG. 18 is a view showing a state where a part of the photoresist film is removed using the photolithographic technique after the photoresist film is patterned from the state shown in FIG. 17.
Figure 19:
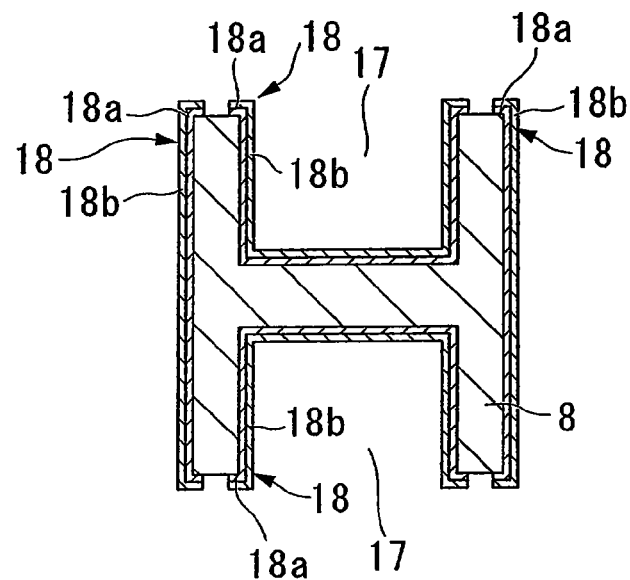
FIG. 19 is a view showing a state where the wafer is etched using the photoresist film as a mask from the state shown in FIG. 18.

Subsequently, as is shown in FIG. 18, after the photoresist film 41 is deposited by means of spray coating or the like, the photoresist film 41 is patterned using the photolithographic technique (S42). In this instance, the photoresist film 41 is patterned so that portions where the electrode film 18 needs to be left are coated with the photoresist film 41. Then, as is shown in FIG. 19, the etching step of etching the electrode film 18 is performed using the remaining photoresist film 41 as a mask (S43). Consequently, the electrode film 18, in which the base metal layer 18a and the finishing metal layer 18b are laminated, is formed.

Figure 20:
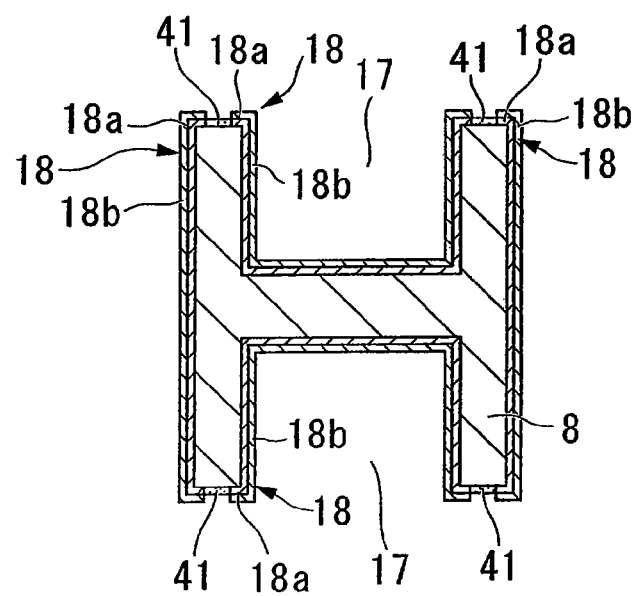
FIG. 20 is a view showing a state where a part of the photoresist film is removed using the photolithographic technique after a photoresist film is patterned from the state shown in FIG. 19.
Figure 21:
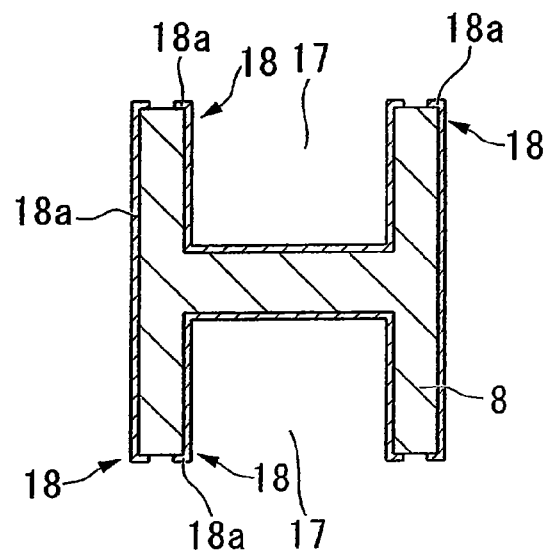
FIG. 21 is a view showing a state where the finishing metal layer is removed by etching using the photoresist film as a mask from the state shown in FIG. 20.

Subsequently, the finishing metal layer 18b of the electrode 18 present on the single layer region R is removed. To be more concrete, in order to remove the finishing metal layer 18b, as is shown in FIG. 20, a photoresist film 41 is patterned using the photolithographic technique (S44). In this instance, the photoresist film 41 is patterned in portions where the finishing metal layer 18b needs to be left and portions where the piezoelectric plates 11 are exposed. Then, as is shown in FIG. 21, the finishing metal layer 18b is etched using the photoresist mask 41 as a mask (S45). Consequently, the finishing metal layer 18b can be removed from the electrode film 18 present on the single-layer region R.

The electrode forming step ends by performing the steps described above.

After the electrode forming step ends, the weight metal film 21 (for example, silver or gold) formed of the rough tuning film 21a and the fine tuning film 21b for the frequency tuning is coated on the tip ends of a pair of the vibrating arms 8 and 9 (S51). The rough tuning step of roughly tuning the resonance frequency is then performed for all the vibrating arms formed on the quartz wafer S. This is a step of roughly tuning the frequency by reducing the weight on the tip ends of a pair of the vibrating arms 8 and 9 by irradiating a laser beam to the rough tuning film 21a of the weight metal film 21.

Subsequently, the cutting step of separating a plurality of piezoelectric vibrating reeds 2 off from the wafer S in the form of small pieces is performed by cutting the connection portions connecting the wafer S and the piezoelectric vibrating reeds 2 (S52). A plurality of the piezoelectric vibrating reeds 2 each provided with the electrode film 18 (the exciter electrode 14, the extraction electrodes 19 and 20, and the mount electrodes 15 and 16) can be thus manufactured at a time from the wafer S.

Subsequently, before the piezoelectric vibrating reed 2 is mounted, the resonance frequency is adjusted roughly (S53). This rough tuning is performed by changing the weight with irradiation of a laser beam onto the rough tuning film 21a of the weight metal film 21 so as to be evaporated by a part thereof. Fine tuning to tune the resonance frequency at high accuracy is performed later, which will be described below.

Subsequently, the airtight terminal manufacturing step of manufacturing the plug 4 is performed (S60). To be more concrete, the stem 30 is manufactured first by the stem manufacturing step (S61). In other words, lancing is applied to a plate member having the conductivity, such as iron-nickel-cobalt alloy and iron-nickel alloy, and then deep drawing is repeated several times to form a bottomed tube member. The stem 30 is manufactured by providing an opening in the bottom surface of the tube member and separating the tube member off from the plate member by blanking punching.

Subsequently, the setting step of setting the lead terminals 31 and the filling material 32 inside the stem 30 is performed (S62). The manufactured stem 30 is set to an unillustrated exclusive-use jig first, and thence the filling material 32 preliminarily sintered in the shape of a ring is set inside the stem 30 while the lead terminals 31 are set so as to penetrate through the filling material 32.

After the stem 30, the lead terminals 31, and the filling material 32 are combined in the setting step, the filling material 32 is sintered under temperature atmosphere at about 1000° C. by inserting the jig inside the heating oven (S63). Consequently, the filling material 32 and the lead terminals 31 as well as the filling material 32 and the stem 30 are sealed completely to have a structure that can withstand air-tightness. The plug 4 is obtained when pulled out from the jig. The airtight terminal manufacturing step ends at this point.

Subsequently, the plating step of coating the outer surfaces of the lead terminals 31 and the outer circumference of the stem 30 with metal films made of the same material is performed by means of wet plating (S71). To this end, as the pretreatment, the outer surfaces of the lead terminals 31 and the outer circumference of the stem 30 are rinsed and degreased using an alkaline solution, after which acid cleaning using solutions of hydrochloric acid and sulfuric acid is performed. After the pretreatment ends, a base film is formed on the outer surfaces of the lead terminals 31 and the outer circumference of the stem 30. For example, they are coated with a film of Cu plating or Ni plating with a film thickness of about 2 μm to 5 μm. The finishing film is then formed on the base film. For example, besides a single material, such as tin and silver, the base film is coated with a film of heat-resistant plating, tin-copper alloy, tin-bismuth alloy, tin-antimony alloy, and so forth with a film thickness of about 8 μm to 15 μm.

By providing the metal film made of the base film and the finishing film as the coating in this manner, connection between the inner leads 31a and the piezoelectric vibrating reed 2 can be achieved. In addition, because the metal film coated on the outer circumference of the stem 30 has a characteristic that it is so soft that it readily undergoes elastic deformation, not only the connection to the piezoelectric vibrating reed 2, but also cold-welding between the stem 30 and the case 3 can be achieved, which enables airtight joining.

Subsequently, in order to stabilize the metal film, annealing is performed under vacuum atmosphere in the oven (S72). For example, heating is performed at a temperature of 170° C. for one hour. It thus becomes possible to suppress the occurrence of whiskers by adjusting the composition of the intermetallic compound formed at the interface of the material forming the base film and the material forming the finishing film. The mounting step can be performed when this annealing ends. A case where the metal films are coated by means of wet plating has been described by way of example. It should be appreciated, however, that the invention is not limited to this case, and the metal films may be coated, for example, by means of vapor deposition and chemical vapor deposition.

In this embodiment, when the annealing ends, conductive bumps E, such as gold, are formed at the tip ends of the inner leads 31a for the mounting step performed next (S73). The mounting step of joining the mount electrodes 15 and 16 of the piezoelectric vibrating reed 2 to the inner leads 31a is then performed (S74). To be more concrete, the inner leads 31a and the piezoelectric vibrating reed 2 are superimposed at a predetermined pressure with the bumps E in between by heating the bumps E. Accordingly, the inner leads 31a and the mount electrodes 15 and 16 can be connected via the bumps E, which enables the mounting of the piezoelectric vibrating reed 2. In other words, the piezoelectric vibrating reed 2 is not only mechanically supported on the lead terminals 31 but also electrically connected to the lead terminals 31.

Mounting is performed by heating and applying a pressure for the bump connection. However, ultrasonic waves may be used for the bump connection.

Subsequently, in order to eliminate deformation caused by the mounting, baking is performed at a predetermined temperature before the encapsulating step (S75). Subsequently, the frequency tuning (fine tuning) of the piezoelectric vibrating reed 2 is performed (S76). To be more concrete about this frequency tuning, the entire assembly is placed in a vacuum chamber and the piezoelectric vibrating reed 2 is vibrated by applying a voltage between the outer leads 31b. The frequency is tuned by letting the fine turning film 21b of the weight metal film 21 evaporate with a laser beam while measuring the frequency. When the frequency is measured, by pressing the tip end of an unillustrated probe against the outer leads 31b, the frequency can be measured accurately. By performing the frequency tuning, it becomes possible to tune the frequency of the piezoelectric vibrating reed 2 so as to fall within the predetermined range of frequency.

The frequency tuning is performed by letting the weight metal film 21 evaporate with irradiation of a laser beam at the time of the fine tuning and the rough tuning performed earlier. However, argon ions may be used instead of a laser beam. In this case, the frequency tuning is performed by removing the weight metal film 21 by means of sputtering with irradiation of argon ions.

Finally, the case press-fitting step of hermetically encapsulating the piezoelectric vibrating reed 2 is performed by press-fitting the case 3 to the stem 30 so that the mounted piezoelectric vibrating reed 2 is accommodated inside the case 3 (S77). To be more concrete, the case 3 is press-fit to the outer circumference of the stem 30 of the plug 4 under vacuum with an application of a predetermined load. Accordingly, the metal film formed on the outer circumference of the stem 30 undergoes elastic deformation and hermetical sealing is enabled by cold-welding. It thus becomes possible to encapsulate the piezoelectric vibrating reed 2 under vacuum inside the case 3 by means of hermetical sealing.

It is preferable to eliminate surface absorbed moisture or the like by heating the piezoelectric vibrating reed 2, the case 3, and the plug 4 sufficiently before this step is performed.

Screening is then performed when the fixing of the case 3 ends (S78). Screening is performed in order to stabilize the frequency and the resonance resistance value and also to suppress the occurrence of metal whiskers resulting from compression stress in the fit portion where the case 3 is press-fit. When the screening ends, the internal electric characteristic test is conducted (S79). More specifically, the resonance frequency, the resonance resistance value, the drive level characteristic (the exciting power dependency of the resonance frequency and the resonance resistance value), and so forth of the piezoelectric vibrating reed 2 are measured and checked. The insulation resistance characteristic and the like are checked as well. Finally, the outward appearance test of the piezoelectric vibrator 1 is performed to check the dimension, the quality, and so forth for the last time. Consequently, a plurality of the piezoelectric vibrators 1 shown in FIG. 1 can be manufactured at a time.

In particular, in the electrode forming step, the base metal layer 18a and the finishing metal layer 18b are not laminated across the entire outer surfaces of the piezoelectric plate 11, and instead, the electrode film 18 is formed in such a manner that the finishing metal layer 18b is removed entirely at least in the regions from the base end portions to the tip end portions of the vibrating arms 8 and 9. Accordingly, the electrode film 18 formed on the vibrating arms 8 and 9 partially becomes a single-layer film formed of the base metal layer 18a alone. It thus becomes possible to lessen the film thickness of the electrode film 18 coated on the vibrating arms 8 and 9.

Incidentally, when the electrode film 18 is formed, film stress acts on the piezoelectric plate 11. Deformation is thus increased in the piezoelectric plate 11 because of the influence of the film stress and the vibration characteristic varies. The R1 value thus tends to become higher. In particular, the R1 value tends to become higher with an increase of the film thickness.

However, as has been described above, because the film thickness of the electrode film 18 coated on the vibrating arms 8 and 9 can be lessened, it becomes possible to reduce the R1 value in comparison with the one in the related art. The R1 value can be therefore reduced by a method other than the processing of the groove portions 17.

Hence, even when the piezoelectric vibrating reed 2 is made smaller than the size that is determined by the limitation of the groove portion processing in order to ensure the constant R1 value, it is possible to suppress an increase of the R1 value by adjusting the film thickness of the electrode film 18. It thus becomes possible to manufacture the piezoelectric vibrating reed 2 further reduced in size while ensuring the constant R1 value.

Figure 21A:
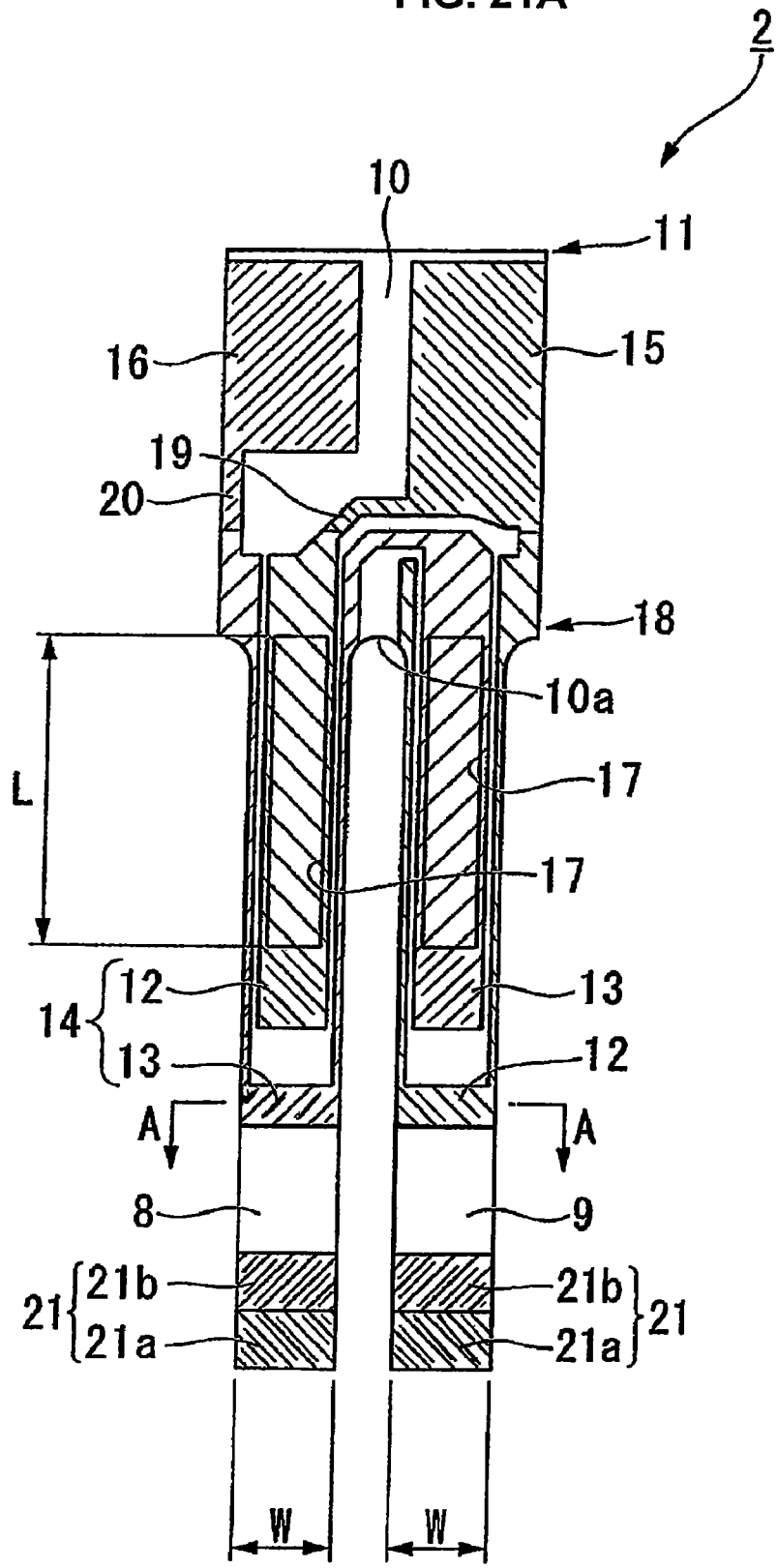
FIG. 21A is a view of the piezoelectric vibrating reed of FIG. 1 showing a region of the electrode layer having only a base metal layer.

In addition, in the electrode film forming step, the finishing metal layer 18b is removed entirely from the base end portions to the positions spaced by at least the certain length L. In other words, as shown by the different cross-hatch regions in FIG. 21A, the electrode film 18 coated entirely on the regions where the groove portions 17 are formed in the vibrating arms 8 and 9 is a single-layer film formed of the base metal layer 18a alone so that the film thickness is lessened.

In particular, because the shape is complex in the regions where the groove portions 17 are formed, the film thickness varies in comparison with a case where the electrode film 18 is formed simply on a flat surface and irregularities readily occur. Film stress therefore readily acts thereon and deformation is increased easily.

However, because the electrode film 18 is a single-layer film across the entire regions where the groove portions 17 are formed, it is possible to reduce the film stress and the load of deformation that act on the piezoelectric plate 11. Hence, the R1 value can be reduced more effectively and a further size reduction can be achieved.

In addition, in the electrode forming step, the finishing metal layer 18b is removed on the both principal surfaces and inside the groove portions 17 of the piezoelectric plate 11. More specifically, the electrode film 18 is formed in such a manner that it is a single-layer film formed of the base metal layer 18a alone inside the entire groove portions 17 and it is also a single-layer film formed of the base metal layer 18a alone on the entire both surfaces of the vibrating arms 8 and 9 at least in the regions where the groove portions 17 are formed.

In particular, because the single-layer film formed of the base metal layer 18a alone is provided inside the groove portions 17 where the film thickness readily becomes irregular, the R1 value can be reduced more effectively.

In addition, in the electrode forming step, the finishing metal layer 18b is removed entirely in the regions from the base end portions toward the base portion 10 to the positions spaced by two times the arm width W of the vibrating arms 8 and 9. In short, the electrode film 18 is formed in such a manner that it is a single-layer film formed of the base metal layer 18*a* alone at least on the crotch portion 10*a*.

In particular, because the shape is complex in the crotch portion 10*a* as with the groove portions 17, the film thickness varies in comparison with a case where the electrode film 18 is simply formed on a flat surface and irregularities readily occur. Film stress therefore readily acts thereon and deformation is increased easily.

However, because the electrode film 18 is a single-layer film entirely at least on the crotch portion 10*a*, it is possible to reduce the film stress and the load of deformation that act on the piezoelectric plate 11. Hence, the R1 value can be reduced more effectively and a further size reduction can be achieved.

Also, because the electrode film 18 is merely made as a single-layer film formed of the base metal layer 18*a* alone only partially, the electrode film 18 as described above can be formed without using any complex shape or special means. The piezoelectric vibrating reed 2 can be therefore manufactured efficiently at a low cost.

Because the single-layer film is provided on the vibrating arms 8 and 9 side and in the vicinity of the crotch portion 10*a*, the finishing metal layer 18*b* remains on the mount electrodes 15 and 16 as in the related art. The ease of mounting and the conductivity therefore remain the same.

Also, in the electrode film forming step, the base metal layer 18*a* is made of chromium and the finishing metal layer 18*b* is made of gold.

Because chromium has high hardness, it is possible to protect the piezoelectric vibrating reed 2 itself when chromium is used for the base metal layer 18*a*. Also, because gold is soft and has a low electric resistance value, it is possible to increase the ease of mounting and the conductivity between the piezoelectric vibrating reed 2 and the lead terminals 31 when gold is used for the finishing metal layer 18*b*.

In other words, by using chromium and gold for the base metal layer 18*a* and the finishing metal layer 18*b*, respectively, not only can the piezoelectric vibrating reed 2 be protected, but also the electrical conductivity can be ensured safely. It thus becomes possible to enhance the quality of the piezoelectric vibrating reed 2.

Further, because the piezoelectric vibrator 1 of this embodiment includes the piezoelectric vibrating reed 2 as described above, it is possible to reduce the piezoelectric vibrator 1 in size while ensuring the constant R1 value. The quality of the piezoelectric vibrator 1 can be therefore enhanced, too.

One embodiment of an oscillator of the invention will now be described with reference to FIG. 22.

Figure 22:
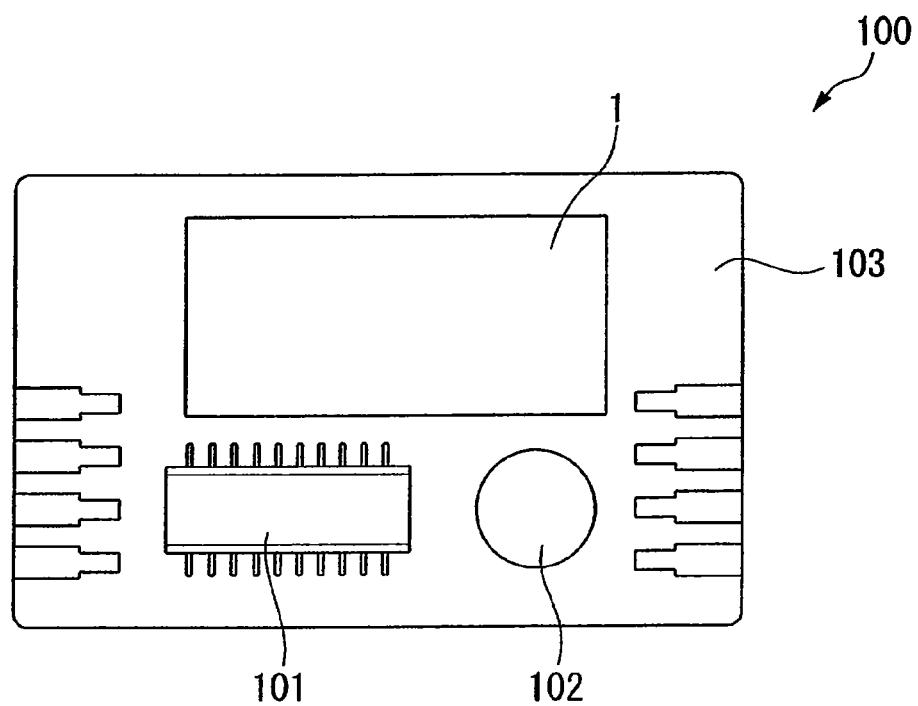
FIG. 22 is a view showing the configuration of one embodiment of an oscillator of the invention.

As is shown in FIG. 22, an oscillator 100 of this embodiment is formed using the piezoelectric vibrator 1 as a resonator electrically connected to an integrated circuit 101. The oscillator 100 includes a printed circuit board 103 on which is mounted an electronic component 102, such as a capacitor. The integrated circuit 101 for oscillator is mounted on the printed circuit board 103 and the piezoelectric vibrator 1 is mounted in the vicinity of the integrated circuit 101. These electronic component 102, integrated circuit 101, and piezoelectric vibrator 1 are electrically interconnected by an unillustrated wiring pattern. It should be noted that these components are molded by unillustrated resin.

In the oscillator 100 configured in this manner, the piezoelectric vibrating reed 2 inside the piezoelectric vibrator 1 vibrates when a voltage is applied to the piezoelectric vibrator 1. This vibration is converted to an electric signal by the piezoelectric characteristic of the piezoelectric vibrating reed 2 and inputted into the integrated circuit 101 as the electric signal. The input electric signal is subjected to various kinds of processing by the integrated circuit 101 and is then outputted as a frequency signal. The piezoelectric vibrator 1 thus functions as a resonator.

By selectively setting the configuration of the integrated circuit 101, for example, an RTC (Real Time Clock) module, to suit the demand, it is possible to add the function to control the operating date or time of the device or an external device or to provide the time or a calendar in addition to the single-function oscillator for clock.

As has been described, according to the oscillator 100 of this embodiment, because it includes the piezoelectric vibrator 1 in a reduced size and with the enhanced quality, the oscillator 100 itself becomes able to reduce the size and enhance the quality. In addition, it becomes possible to obtain a frequency signal at high accuracy in a stable manner over a long period of time.

Figure 23:
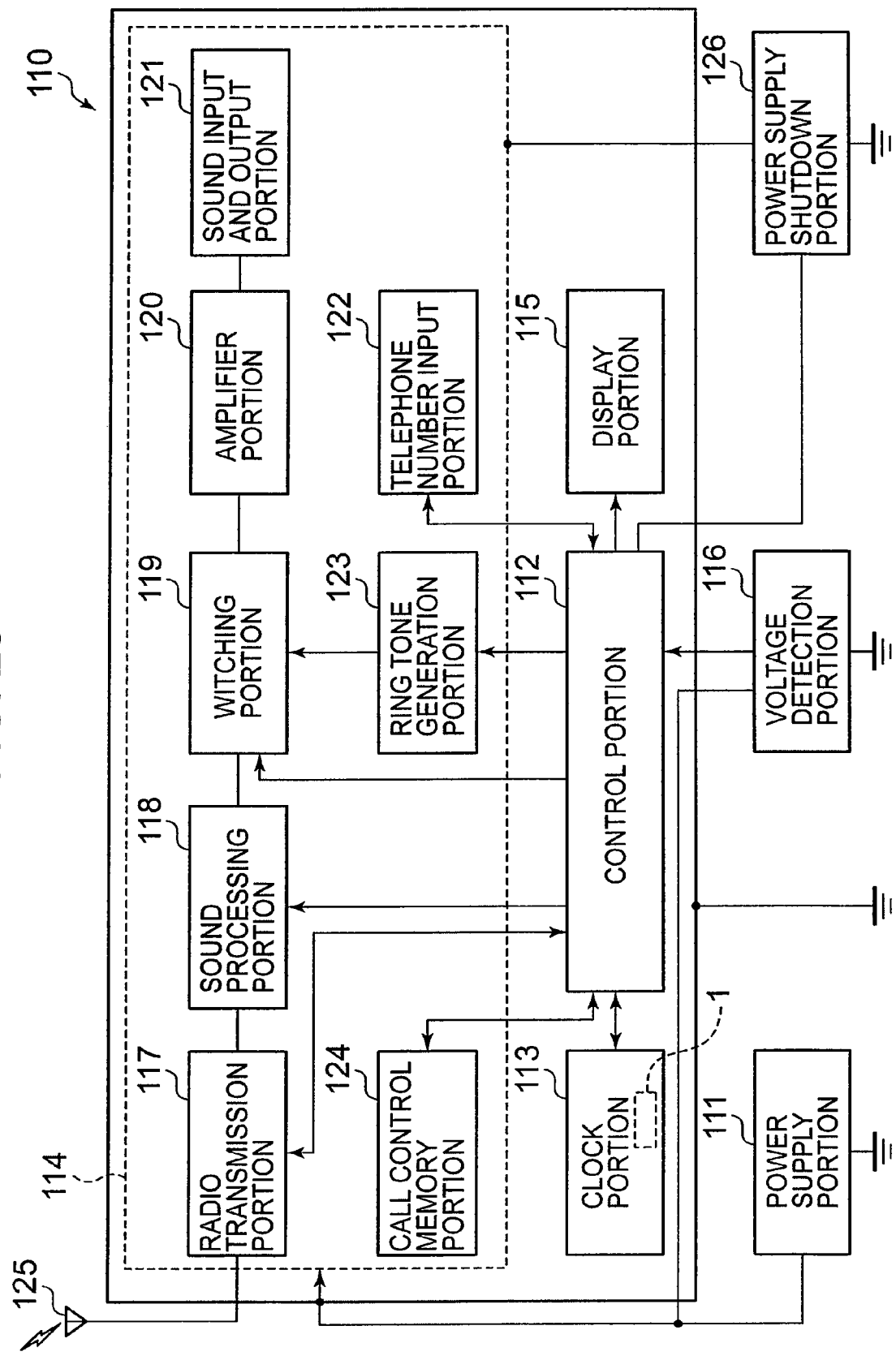
FIG. 23 is a view showing the configuration of one embodiment of an electronic device of the invention.

One embodiment of an electronic device of the invention will now be described with reference to FIG. 23. As an example of the electronic device, descriptions will be given to a personal digital assistance 110 having the piezoelectric vibrator 1 described above. The personal digital assistance 110 of this embodiment is represented, for example, by a cell-phone and it is a developed and improved version of a wrist watch in the related art. It looks like a wrist watch on the outward appearance and a liquid crystal display is provided to the portion corresponding to the dial plate and is capable of displaying the current time or the like on this screen. In a case where it is used as a communication tool, the user removes it from the wrist and makes communications as with a cell-phone in the related art using the internal speaker and microphone on the inner side of the band. It is particularly worth noting that the size and the weight are reduced markedly in comparison with a cell-phone in the related art.

The configuration of the personal digital assistance 110 of this embodiment will now be described. As is shown in FIG. 23, the personal digital assistance 110 includes the piezoelectric vibrator 1 and a power supply portion 111 to supply power. The power supply portion 111 is formed, for example, of a lithium rechargeable battery. A control portion 112 that performs various kinds of control, a clock portion 113 that counts the time or the like, a communication portion 114 that makes communications with the outside, a display portion 115 that displays various kinds of information, and a voltage detection portion 116 that detects voltages at the respective function portions, are connected in parallel to the power supply portion 111. Power is thus supplied to the respective function portions by the power supply portion 111.

The control portion 112 controls the respective function portions so as to control operations of the overall system, such as operations to transmit and receive sound data and operations to count and display the current time. The control portion 112 includes a ROM in which a program is pre-installed, a CPU that reads out and runs the program installed in the ROM, a RAM used as a work area of the CPU, and so forth.

The clock portion 113 includes an integrated circuit enclosing an oscillation circuit, a register circuit, a counter circuit, and an interface circuit, and so forth as well as the piezoelectric vibrator 1. When a voltage is applied to the piezoelectric vibrator 1, the piezoelectric vibrating reed 2 vibrates, and this vibration is converted to an electric signal by the piezoelectric characteristic of the quartz and inputted into the oscillation circuit as the electric signal. The output of the oscillation circuit is converted to a digital form and counted by the register circuit and the counter circuit. Transmission and reception of signals are carried out with the control portion 112 via the interface circuit, and the current time and the current date or the calendar information is displayed on the display portion 115.

The communication portion 114 is furnished with the same functions as those of the cell-phone in the related art, and includes a radio transmission portion 117, a sound processing portion 118, a switching portion 119, an amplifier portion 120, a sound input and output portion 121, a telephone number input portion 122, a ring tone generation portion 123, and a call control memory portion 124.

The radio transmission portion 117 carries out transmission and reception of various kinds of data, such as sound data, with the base station via an antenna 125. The sound processing portion 118 encodes and decodes a sound signal inputted therein from the radio transmission portion 117 or the amplifier portion 120. The amplifier portion 120 amplifies a signal inputted therein from the sound processing portion 118 or the sound input and output portion 121 to a specific level. The sound input and output portion 121 is formed of a speaker and a microphone, which makes a ring tone and an incoming sound louder and collects sounds.

The ring tone generation portion 123 generates a ring tone in response to a call from the base station. The switching portion 119 switches the amplifier portion 120 normally connected to the sound processing portion 118 to the ring tone generation portion 123 only when a call arrives, so that the ring tone generated in the ring tone generation portion 123 is outputted to the sound input and output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, for example, about 3 V. Upon receipt of a notification of a voltage drop from the voltage detection portion 116, the control portion 112 disables the operation of the radio transmission portion 117, the sound processing portion 118, the switching portion 119, and the ring tone generation portion 123. In particular, it is essential to stop the operation of the radio transmission portion 117 that consumes a large amount of power. Further, a message informing that the communication portion 114 becomes unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, it may be displayed by putting a cross on the telephone icon displayed at the top of the display screen of the display portion 115.

By providing a power supply shutdown portion 126 capable of selectively shutting down the power supply to portions involved with the function of the communication portion 114, it is possible to stop the function of the communication portion 114 in a more reliable manner.

As has been described, according to the personal digital assistance 110 of this embodment, because it includes the piezoelectric vibrator 1 in a reduced size with the enhanced quality, the personal digital assistance 110 itself becomes able to reduce the size and enhance the quality. In addition, it is possible to display clock information at high accuracy in a stable manner over a long period of time.

One embodiment of a wave clock of the invention will now be described with reference to FIG. 24.

Figure 24:
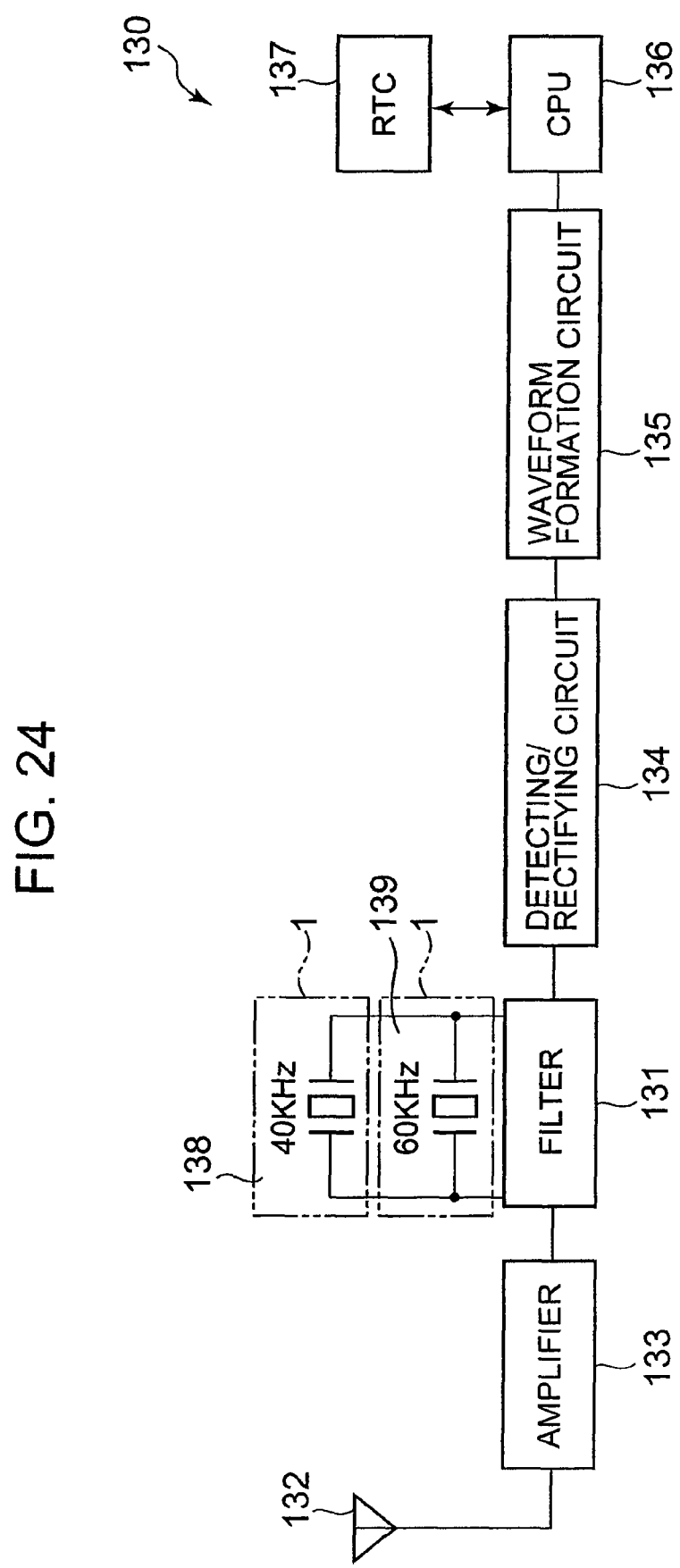
FIG. 24 is a view showing the configuration of one embodiment of a wave clock of the invention.

As is shown in FIG. 24, a wave clock 130 of this embodiment includes the piezoelectric vibrators 1 electrically connected to a filter portion 131, and it is a clock furnished with the function to display the correct time by automatically correcting the time upon receipt of a standard radio wave including the clock information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz has both a nature to propagate along the land surface and a nature to propagate while reflecting between the ionospheric layer and the land surface, and therefore has a propagation range wide enough to cover all over Japan by the two transmission centers.

Hereinafter, the functional configuration of the wave clock 130 will be described more in detail.

An antenna 132 receives the long standard radio wave at 40 kHz or 60 kHz. The long standard radio wave is made up of time information called a time code modulated by the AM modulation scheme on a carrier at 40 kHz or 60 kHz. The received long standard wave is amplified by an amplifier 133 and filtered and synchronized by the filter portion 131 having a plurality of piezoelectric vibrators 1.

In this embodiment, the piezoelectric vibrators 1 include quartz vibrator portions 138 and 139 respectively having resonance frequencies at 40 kHz and 60 kHz same as the carrier frequency.

Further, the filtered signal at the specific frequency is detected and decoded by a rectifying detector circuit 134. Subsequently, the time code is extracted by a waveform shaping circuit 135 and counted by the CPU 136. The CPU 136 reads out information about the current year, the total number of days, a day of the week, and the time. The read information is reflected on the RTC 137 and the precise time information is displayed.

Because the carrier is at 40 kHz or 60 kHz, a vibrator having the tuning-fork structure as described above is suitable for the quartz vibrator portions 138 and 139.

Descriptions have been given using an example in Japan. However, the frequency of the long standard wave is different in overseas. For example, a standard wave at 77.5 kHz is used in Germany. In order to incorporate the wave clock 130 also operable in overseas into a mobile device, the piezoelectric vibrator 1 set at the frequency different from the frequencies used in Japan has to be incorporated.

As has been described, according to the wave clock 130 of this embodiment, because it includes the piezoelectric vibrators 1 in a reduced size with the enhanced quality, the wave clock 130 itself becomes able to reduce the size and enhance the quality. In addition, it is possible to count the time at high accuracy in a stable manner over a long period of time.

While the embodiments of the invention have been described in detail with reference to the drawings, the concrete configurations are not limited to the embodiments above and the invention includes modifications in design without deviating from the scope of the invention. For example, in the embodiments above, the piezoelectric vibrator 1 of a cylinder package type has been described as an example of the piezoelectric vibrator. However, the invention is not limited to the piezoelectric vibrator 1 of this type. For instance, the piezoelectric vibrator may be of a ceramic package type or it may be a surface-mounting type piezoelectric vibrator formed by fixing the cylinder package type piezoelectric vibrator 1 with a mold resin portion.

In the embodiments above, the finishing metal layer 18b is removed entirely in the single-layer region R and the electrode film 18 is therefore a single-layer film formed of the base metal layer 18a. The invention, however, is not limited to this configuration. To be more specific, it is sufficient for the electrode film 18 that the finishing metal layer 18b is removed either partially or entirely at least in the regions from the base end portions to the tip end portions of the vibrating arms 8 and 9. For example, the finishing metal layer 18b may be removed entirely in the region RA alone. Alternatively, the finishing metal layer 18b may be removed only partially in the region RA.

Also, in the embodiments above, the electrode film 18 is formed in the electrode forming step in such a manner that the finishing metal layer 18b is removed in the single-layer region R. Accordingly, the metal layer 18b is removed in the single-layer region R after the finishing metal layer 18b is deposited across the entire electrode film 18. The invention, however, is not limited to this configuration. In other words, it is sufficient that finishing metal layer 18b is removed from the single-layer region R in the end. For example, it may be configured in such a manner that the finishing metal layer 18b is removed in the single-layer region R by depositing the finishing metal layer 18b by masking the single-layer region R after the base metal layer 18a is deposited.

The result of the R1 value obtained by vibrating the piezoelectric vibrating reed of the invention and the piezoelectric vibrating reed in the related art by applying a predetermined voltage will now be described.

As the piezoelectric vibrating reed of the invention, the one satisfying the conditions as follows was used. That is, a piezoelectric vibrating reed is used that is formed in such a manner that the finishing metal layer is removed from the both principal surfaces of the vibrating arms in the regions where the groove portions are formed and inside the groove portions.

Under the same conditions except for the configuration of the electrode film as specified above, the piezoelectric vibrating reed in the related art and the piezoelectric vibrating reed of the invention were used. To be more concrete, regarding the material and the thickness of the electrode film, in both of the piezoelectric vibrating reeds, chromium was used as the material of the base metal layer and the thickness thereof was 600 angstroms, while gold was used as the material of the finishing metal layer and the thickness thereof was 1500 angstroms.

As the piezoelectric vibrating reed in the related art and the piezoelectric vibrating reed of the invention satisfying the conditions specified above, four types of each were prepared by changing the arm width of the vibrating arms (90 μm, 100 μm, 110 μm, and 130 μm). The R1 values were compared by applying a predetermined voltage to each.

Figure 25:
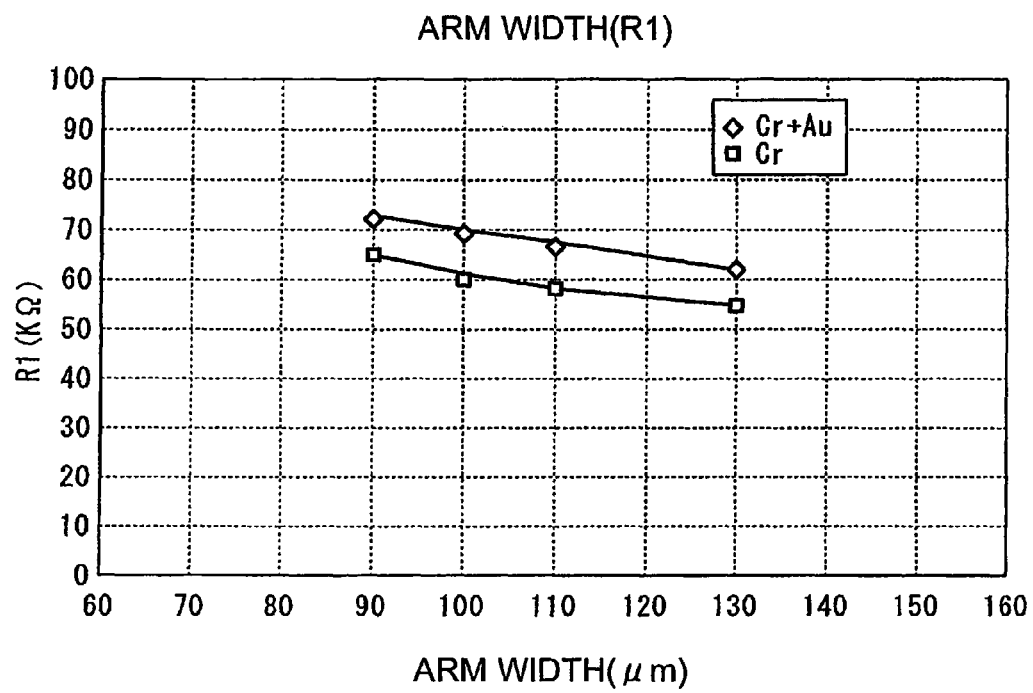
FIG. 25 is a view showing the result of an example using the piezoelectric vibrating reed of the invention.
Figure 26:
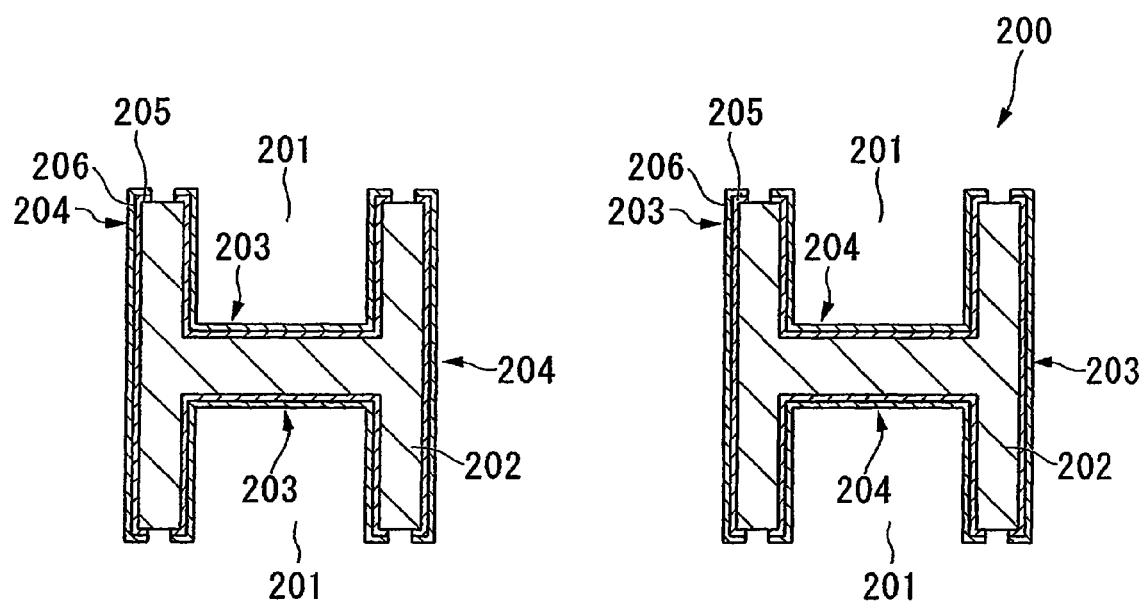
FIG. 26 is a cross section of a pair of vibrating arms of a piezoelectric vibrating reed in the related art.

The result of comparison is set forth in FIG. 25 as a graph. The graph in FIG. 25 uses the abscissa for the arm width (μm) of the vibrating arms and the ordinate for the R1 value (kΩ). It is a graph that plots the R1 value of the piezoelectric vibrating reed in the related art (legend: Cr+Au) and the R1 value of the piezoelectric vibrating reed of the invention (legend: Cr) having the vibrating arms with the respective arm widths.

It can be confirmed from the result that the R1 value of the invention is about 10% lower than the R1 value in the related art even when the piezoelectric vibrating reeds with any arm width are compared. It is therefore confirmed that the R1 value can be lowered by adjusting the film thickness alone. In other words, it is actually confirmed that the R1 value can be reduced by means other than the groove portion processing.

According to the piezoelectric vibrating reed of the invention, it is possible to provide a tuning-fork piezoelectric vibrating reed capable of ensuring the constant R1 value while achieving a further size reduction According to the manufacturing method of a piezoelectric vibrating reed of the invention, it is possible to manufacture the piezoelectric vibrating reed as above efficiently, which can save the cost.

According to the piezoelectric vibrator, the oscillator, the electronic device, the wave clock of the invention, because each includes the piezoelectric vibrating reed as above, not only can the quality be enhanced, but also the size can be reduced.

What is claimed is:

1. A piezoelectric vibrating reed, comprising:
a piezoelectric plate having a pair of vibrating arms extending parallel to each other, a base portion integrally fixing the pair of vibrating arms thereto at a base end side thereof, and groove portions on principal surfaces of the pair of vibrating arms, the groove portions having the same length from base end portions toward tip end portions of the vibrating arms; and
an electrode film comprising a base metal layer and a finishing metal layer, the electrode film laminated on outer surfaces of the piezoelectric plate and configured to vibrate the pair of vibrating arms when a predetermined voltage is applied thereon,
wherein the finishing metal layer of the electrode film is at least partially discontinuous such that the base metal layer is exposed in regions of the vibrating arms between the base end portions and the tip end portions.

2. The piezoelectric vibrating reed according to claim 1, wherein:
the finishing metal layer of the electrode film is at least partially discontinuous from the base end portions to positions spaced by at least the length of the groove portions.

3. The piezoelectric vibrating reed according to claim 2, wherein:
the finishing metal layer of the electrode film is discontinuous on the principal surfaces and in the groove portions of the piezoelectric plate.

4. The piezoelectric vibrating reed according to claim 1, wherein:
the base metal layer comprises chromium; and
the finishing metal layer comprises gold.

5. A piezoelectric vibrator, comprising the piezoelectric vibrating reed set forth in claim 1.

6. An oscillator, comprising:
the piezoelectric vibrator set forth in claim 5,
wherein the piezoelectric vibrator is electrically connected to an integrated circuit as a resonator.

7. An electronic device, comprising:
the piezoelectric vibrator set forth in claim 5,
wherein the piezoelectric vibrator is electrically connected to a clock portion.

8. A wave clock, comprising:
the piezoelectric vibrator set forth in claim 5,
wherein the piezoelectric vibrator is electrically connected to a filter portion.

9. A piezoelectric vibrating reed having a serial resonance resistance value that is substantially independent of relative structural dimensions, the vibrating reed comprising:

a piezoelectric plate having a pair of vibrating arms extending parallel to each other, a base portion integrally fixing the pair of vibrating arms thereto at a base end side thereof, and groove portions on principal surfaces of the pair of vibrating arms, the groove portions having the same length from base end portions toward tip end portions of the vibrating arms; and an electrode film comprising a base metal layer and a finishing metal layer, the electrode film laminated on outer surfaces of the piezoelectric plate in an electrode pattern configured to vibrate the pair of vibrating arms when a predetermined voltage is applied thereon, wherein the electrode film comprises a single layer of base metal in the groove portions and regions of the vibrating arms in immediate proximity to the groove portions.

* * * * *